(12) United States Patent
Itou

(10) Patent No.: US 11,573,469 B2
(45) Date of Patent: Feb. 7, 2023

(54) ARRAY SUBSTRATE AND LIQUID CRYSTAL DISPLAY DEVICE

(71) Applicant: Japan Display Inc., Tokyo (JP)

(72) Inventor: Osamu Itou, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 346 days.

(21) Appl. No.: 17/002,795

(22) Filed: Aug. 26, 2020

(65) Prior Publication Data

US 2020/0387038 A1 Dec. 10, 2020

Related U.S. Application Data

(63) Continuation of application No. PCT/JP2019/002354, filed on Jan. 24, 2019.

(30) Foreign Application Priority Data

Mar. 2, 2018 (JP) .............................. JP2018-037618

(51) Int. Cl.
*G02F 1/1362* (2006.01)
*G02F 1/1337* (2006.01)
*H01L 27/12* (2006.01)

(52) U.S. Cl.
CPC ...... *G02F 1/136286* (2013.01); *G02F 1/1337* (2013.01); *H01L 27/124* (2013.01); *H01L 27/1218* (2013.01); *G02F 1/136222* (2021.01); *G02F 2201/121* (2013.01); *G02F 2201/123* (2013.01)

(58) Field of Classification Search
CPC ............. G02F 1/136286; G02F 1/1337; G02F 1/136222; G02F 2201/121; G02F 2201/123; H01L 27/1218; H01L 27/124
USPC ........................................................ 257/105
See application file for complete search history.

(56) References Cited

FOREIGN PATENT DOCUMENTS

JP 07-013180 A 1/1995
JP 2017191183 A * 10/2017 ....... G02F 1/134309

* cited by examiner

*Primary Examiner* — Edward J Glick
*Assistant Examiner* — William D Peterson
(74) *Attorney, Agent, or Firm* — Xsensus LLP

(57) ABSTRACT

According to one embodiment, an array substrate includes a semiconductor layer, scanning and signal lines, first and second insulating layers, a pedestal and a pixel electrode. The scanning line is opposed to the semiconductor layer. The first insulating layer is provided above the semiconductor layer. The signal line and the pedestal are connected to the semiconductor layer through first and second contact holes in the first insulating layer. The second insulating layer is provided above the pedestal. The pixel electrode is connected to the pedestal through a third contact hole in the second insulating layer. The signal line and the pedestal are provided in layers different from each other.

16 Claims, 20 Drawing Sheets

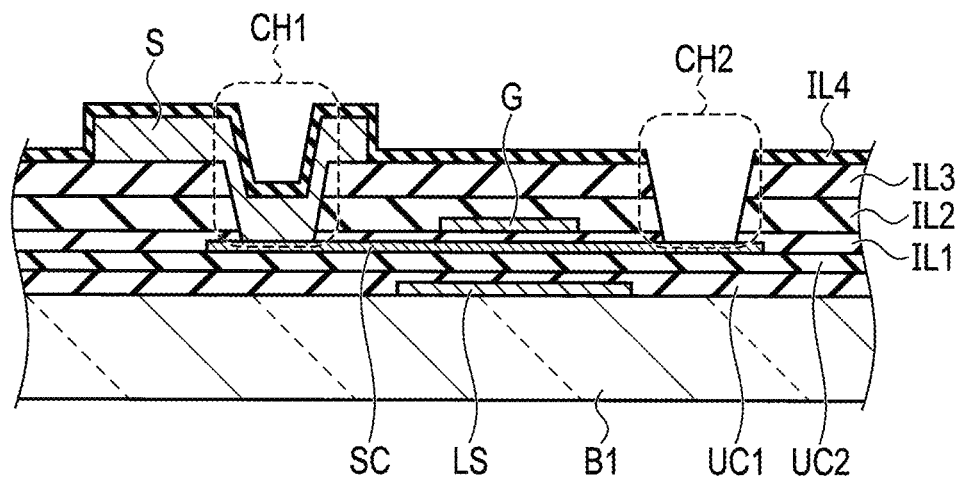
F I G. 6E
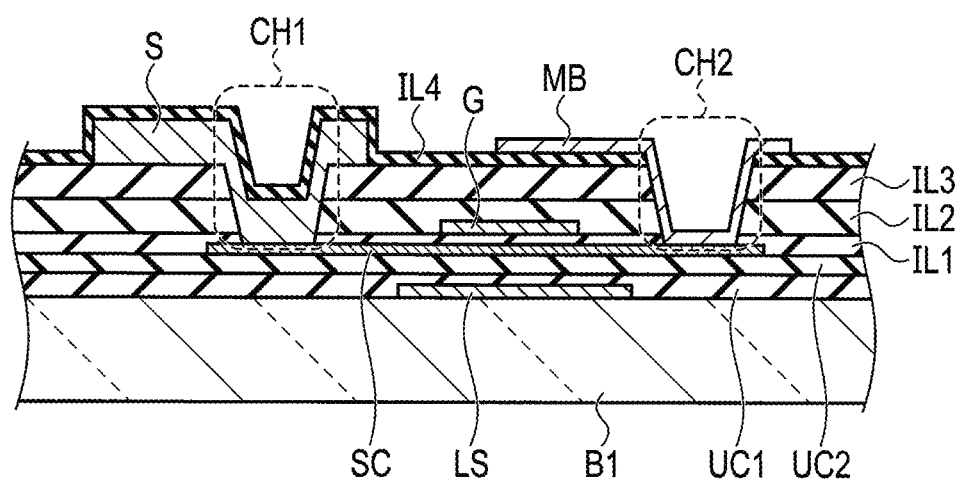
F I G. 6F

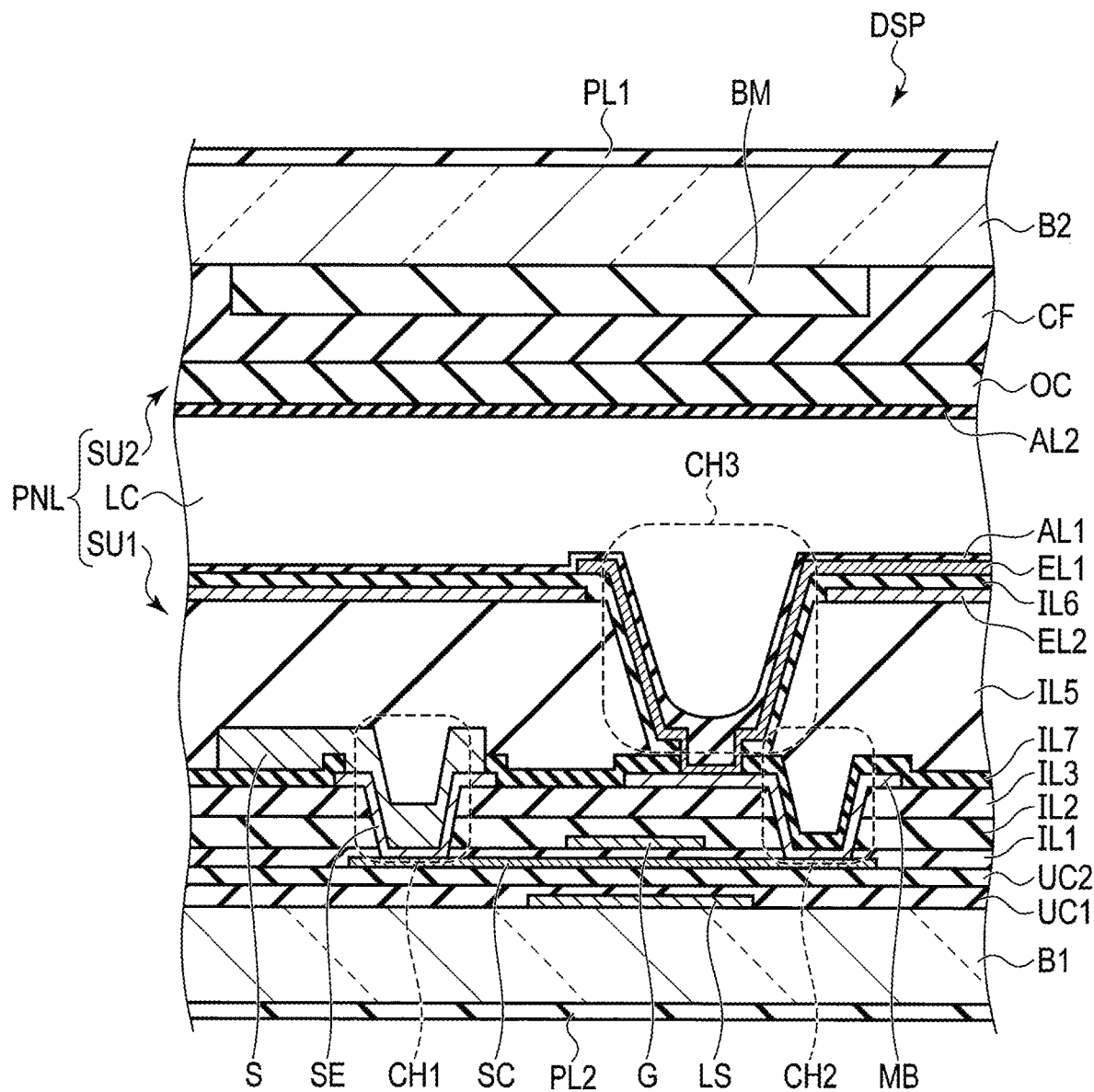
F I G. 10

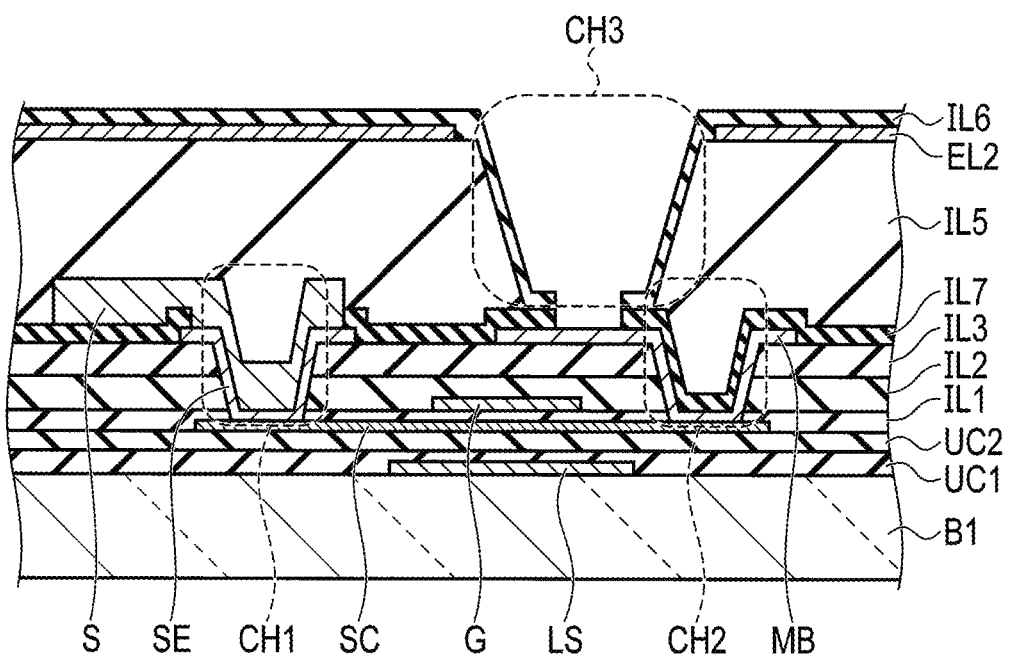
F I G. 11F
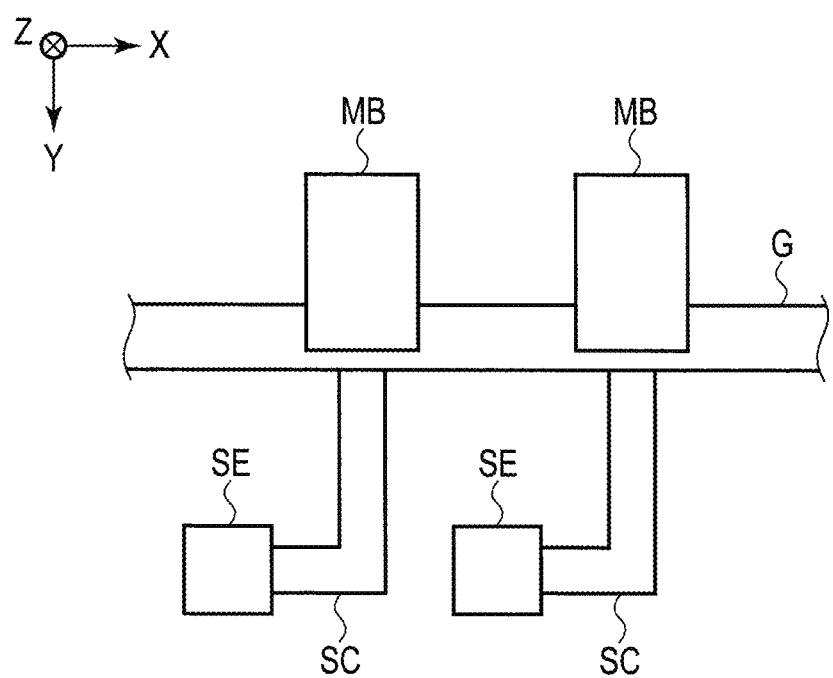
F I G. 12A

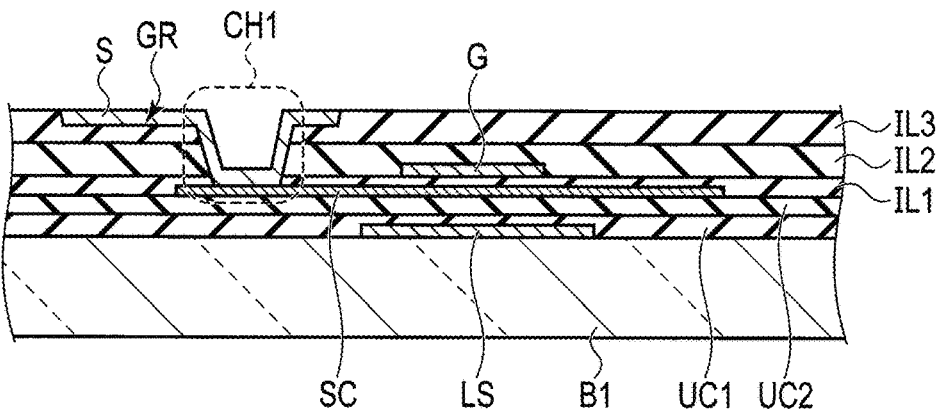
F I G. 14E
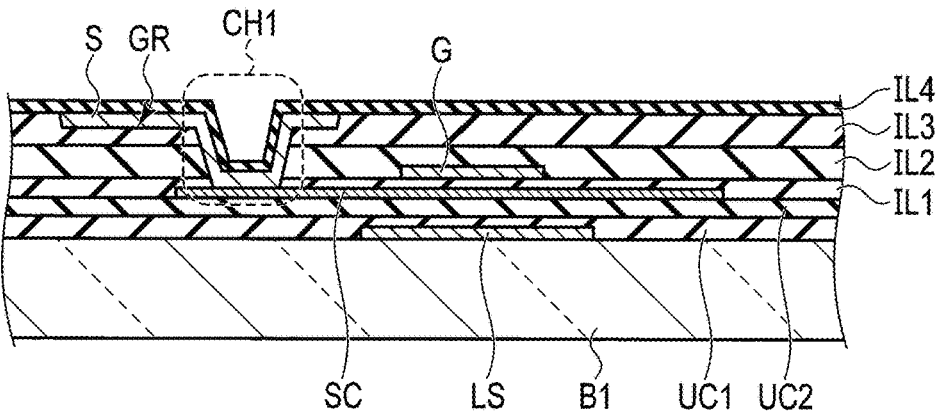
F I G. 14F
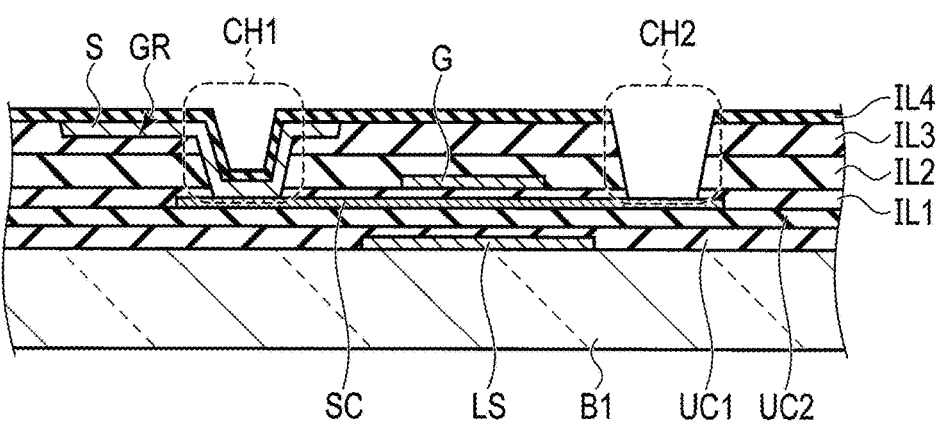
F I G. 14G

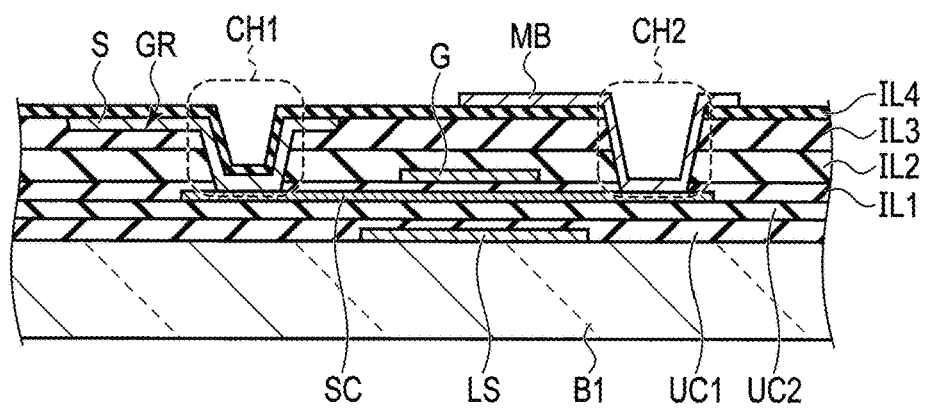
F I G. 14H
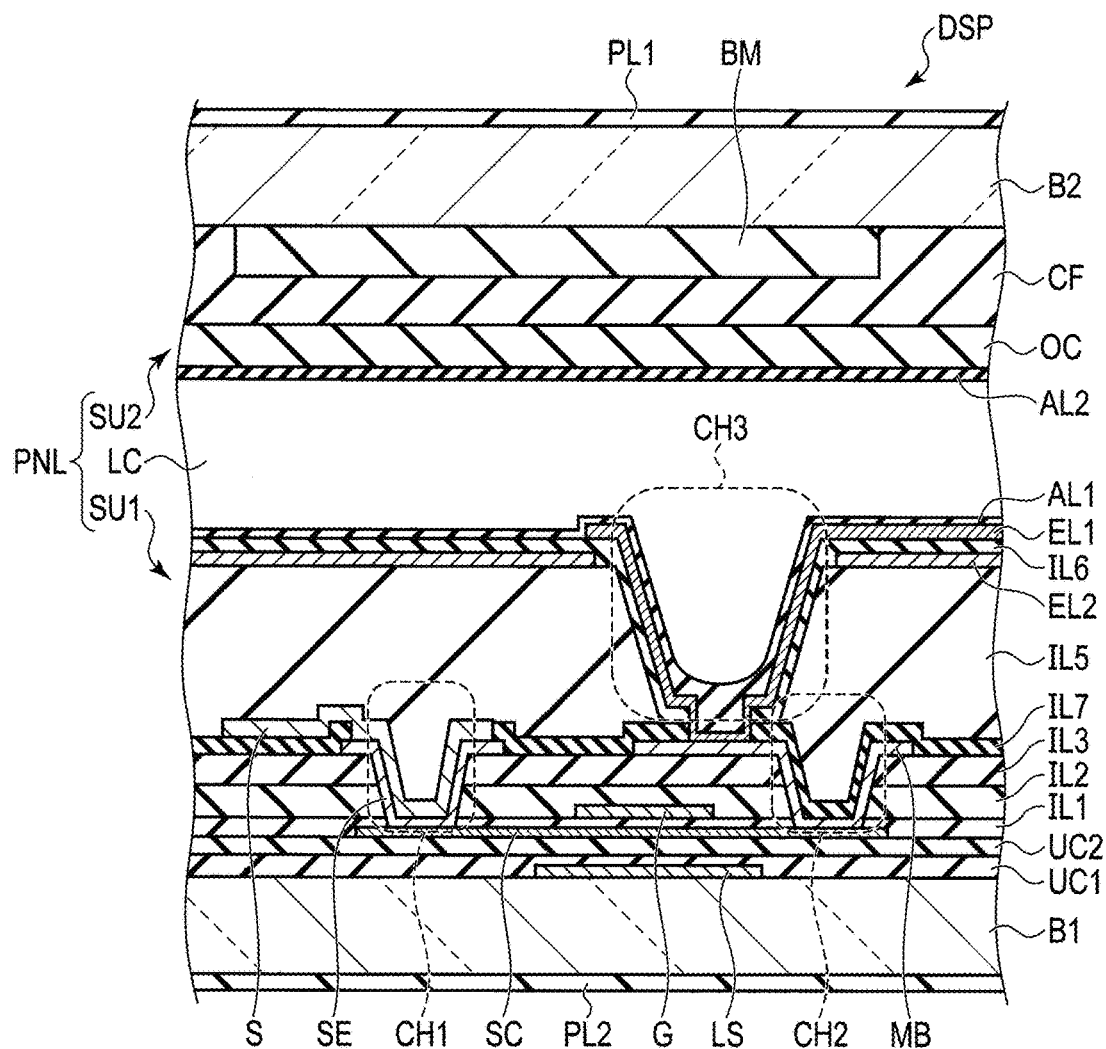
F I G. 15

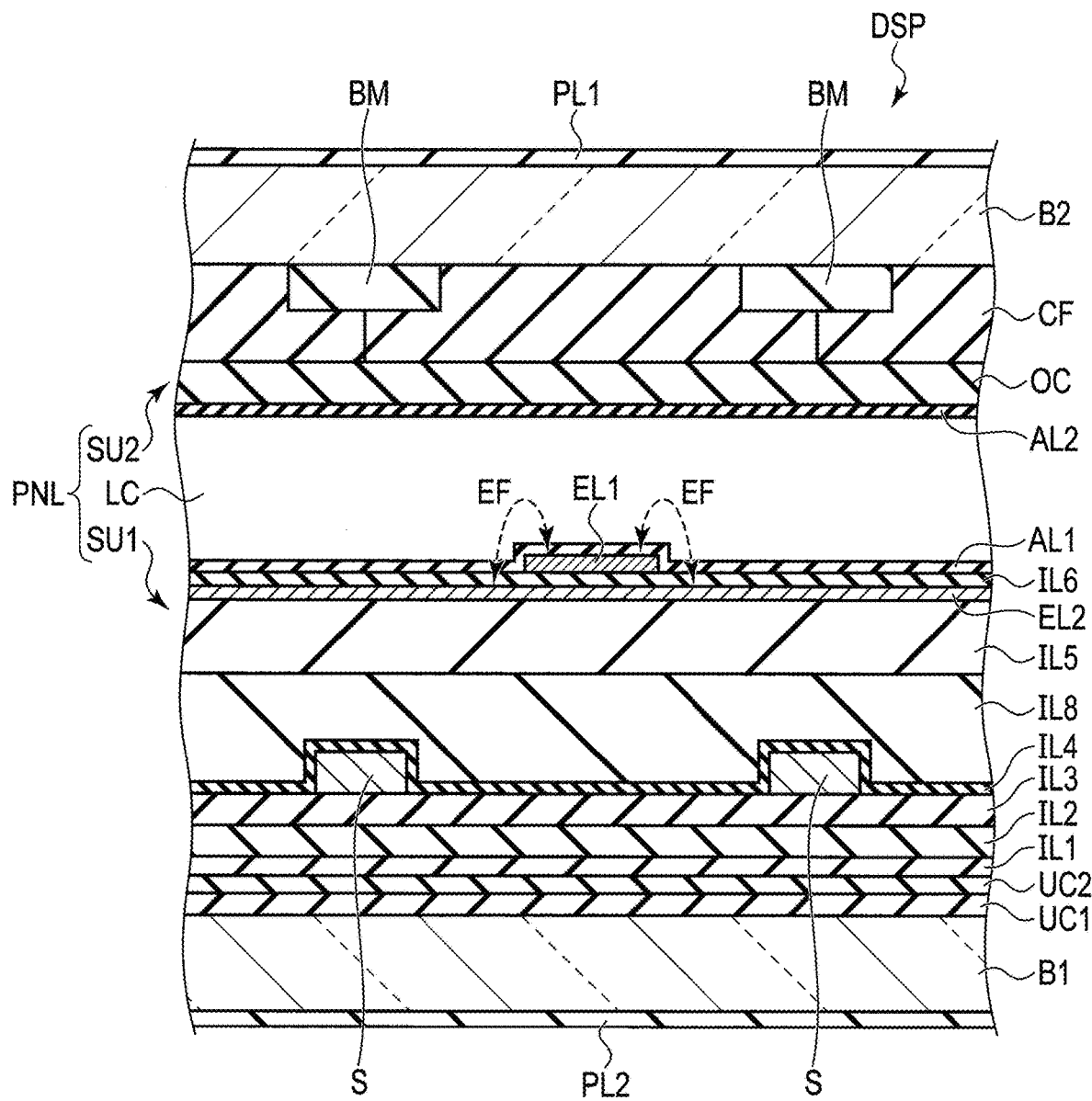
F I G. 17

ARRAY SUBSTRATE AND LIQUID CRYSTAL DISPLAY DEVICE

CROSS-REFERENCE TO RELATED APPLICATIONS

This application is a Continuation Application of PCT Application No. PCT/JP2019/002354, filed Jan. 24, 2019 and based upon and claiming the benefit of priority from Japanese Patent Application No. 2018-037618, filed Mar. 2, 2018, the entire contents of all of which are incorporated herein by reference.

FIELD

Embodiments described herein relate generally to an array substrate and a liquid crystal display device.

BACKGROUND

A display device comprises a signal line to which a video signal is supplied, a pixel electrode arranged in a pixel, and switching element interposed between the signal line and the pixel electrode. The switching element comprises a semiconductor layer electrically connected to each of the signal line and the pixel electrode.

The pixel electrode may be formed of, for example, a transparent conductive material such as indium-tin-oxide (ITO). In this case, since adherence between the semiconductor layer and the transparent conductive material is low, it is difficult to directly connect the semiconductor layer and the pixel electrode. Thus, in a conventional display device, a metallic pedestal, which is formed by patterning with the same material as that of the signal line and simultaneously with the signal line, is interposed between the semiconductor layer and the pixel electrode, so that these two are indirectly connected.

Recently, requests for achieving high definition in a display device, and improving a moving image display capability of the display device have been increasing. The moving image display capability can be improved by increasing a drive frequency, for example. However, in this case, the thickness of the signal line needs to be sufficiently increased in order to prevent a delay in the video signals. In such an event, a layer, which becomes a base for the signal line and the pedestal, needs to be patterned minutely, but this entails difficulty in terms of manufacturing technique. Consequently, it is not possible to make a display device achieve high definition sufficiently.

BRIEF DESCRIPTION OF THE DRAWINGS

FIG. 6E is a schematic cross-sectional view showing the manufacturing process subsequent to FIG. 6D.

FIG. 6F is a schematic cross-sectional view showing the manufacturing process subsequent to FIG. 6E.

FIG. 10 is a schematic cross-sectional view of a display panel provided in a display device according to a second embodiment.

FIG. 11F is a schematic cross-sectional view showing the manufacturing process subsequent to FIG. 11E.

FIG. 12A is a schematic plan view showing the manufacturing process of the first substrate of the second embodiment.

FIG. 14E is a schematic cross-sectional view showing the manufacturing process subsequent to FIG. 14D.

FIG. 14F is a schematic cross-sectional view showing the manufacturing process subsequent to FIG. 14E.

FIG. 14G is a schematic cross-sectional view showing the manufacturing process subsequent to FIG. 14F.

FIG. 14H is a schematic cross-sectional view showing the manufacturing process subsequent to FIG. 14G.

FIG. 15 is a schematic cross-sectional view of a display panel provided in a display device according to a fourth embodiment.

FIG. 17 is a schematic cross-sectional view of the display panel at a position different from FIG. 16.

DETAILED DESCRIPTION

Figure 1:
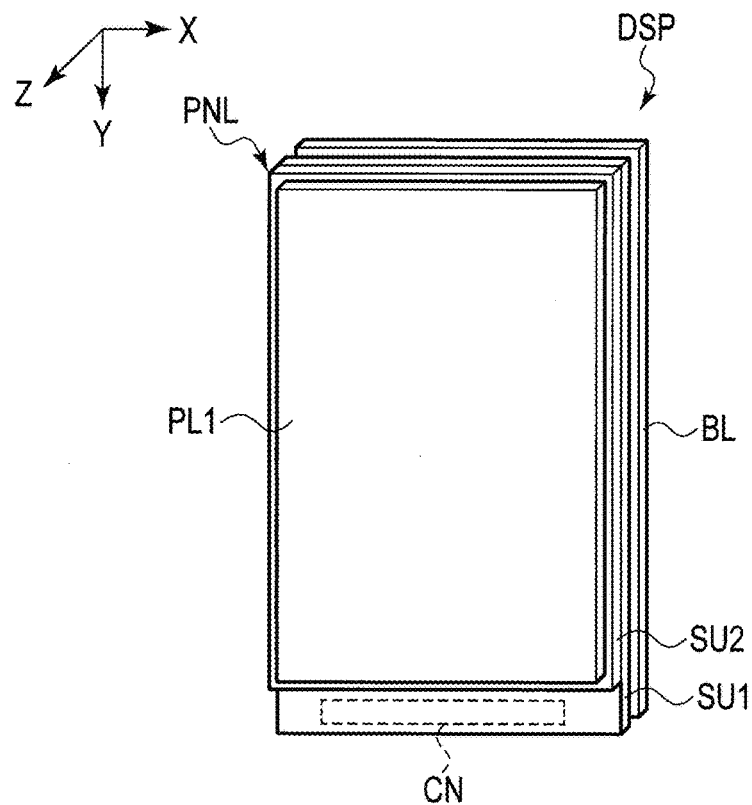
FIG. 1 is a perspective view showing an example of an appearance of a liquid crystal display device according to a first embodiment.

In general, according to one embodiment, an array substrate includes a semiconductor layer, a scanning line, a first insulating layer, a signal line, a pedestal, a second insulating layer, and a pixel electrode. The scanning line is opposed to the semiconductor layer, and a scanning signal is supplied to the scanning line. The first insulating layer is provided above the semiconductor layer. The signal line is electrically connected to the semiconductor layer through a first contact hole penetrating through the first insulating layer, and a video signal is supplied to the signal line. The pedestal is in contact with the semiconductor layer through a second contact hole penetrating through the first insulating layer. The second insulating layer is provided above the pedestal. The pixel electrode is connected to the pedestal through a third contact hole penetrating through the second insulating layer. The signal line and the pedestal are provided in layers different from each other.

According to such a configuration, an array substrate and a liquid crystal display device for which achieving high definition is possible can be provided.

Some embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the present specification and drawings, structural elements which function in the same or a similar manner to those described in connection with preceding drawings are denoted by like reference numbers, and detailed explanations of them that are considered redundant may be arbitrarily omitted.

In each of the embodiments, as an example of the display device, a transmissive liquid crystal display device will be described. The liquid crystal display device can be used in various devices such as a virtual reality (VR) viewer, a smartphone, a tablet device, a cellular phone unit, a personal computer, a television receiver, an in-vehicle device, a game console, and a monitor for a digital camera.

Note that each of the embodiments does not inhibit application of individual technical ideas that are disclosed in the embodiments to the other types of display devices. For example, at least a part of the configuration disclosed in each of the embodiments can also be applied to a reflective liquid crystal display device, a self-luminous display device including an organic electroluminescent element, an electronic paper display device including an electrophoretic element, a display device employing micro-electromechanical systems (MEMS), or a display device employing electrochromism.

First Embodiment

FIG. 1 is a perspective view showing an example of an appearance of a liquid crystal display device DSP (hereinafter referred to as a display device DSP) according to a first embodiment. In the description provided below, an X direction, a Y direction, and a Z direction are defined as illustrated in the drawing. While the X direction, the Y direction, and the Z direction are directions that cross each other perpendicularly, for example, the directions may cross each other by an angle that is not a perpendicular angle. The direction indicated by an arrow of the Z direction may be referred to as above or upper, and the opposite direction may be referred to as below or lower.

The display device DSP comprises a display panel PNL, an illumination device BL, and a first polarizer PL1. The display panel PNL, the illumination device BL, and the first polarizer PL1 are stacked in layers in the Z direction. Note that a second polarizer PL2, which will be described later, is arranged between the display panel PNL and the illumination device BL.

The display panel PNL comprises a first substrate SU1 (array substrate), a second substrate SU2 (counter-substrate), and a liquid crystal layer (liquid crystal layer LC which will be described later) arranged between the first substrate SU1 and the second substrate SU2. The first substrate SU1 comprises a connection portion CN. The connection portion CN includes a terminal for connecting a signal supply source such as a flexible printed circuit, an IC chip, or the like.

For example, the illumination device BL comprises: a light guide opposed to the first substrate Sill; a light source such as a plurality of light-emitting diodes (LEDs) disposed along an edge portion of the light guide; and an optical sheet such as a prism sheet or a diffusion sheet arranged between the light guide and the display panel PNL. However, the configuration of the illumination device BL is not limited to the above example.

Figure 2:
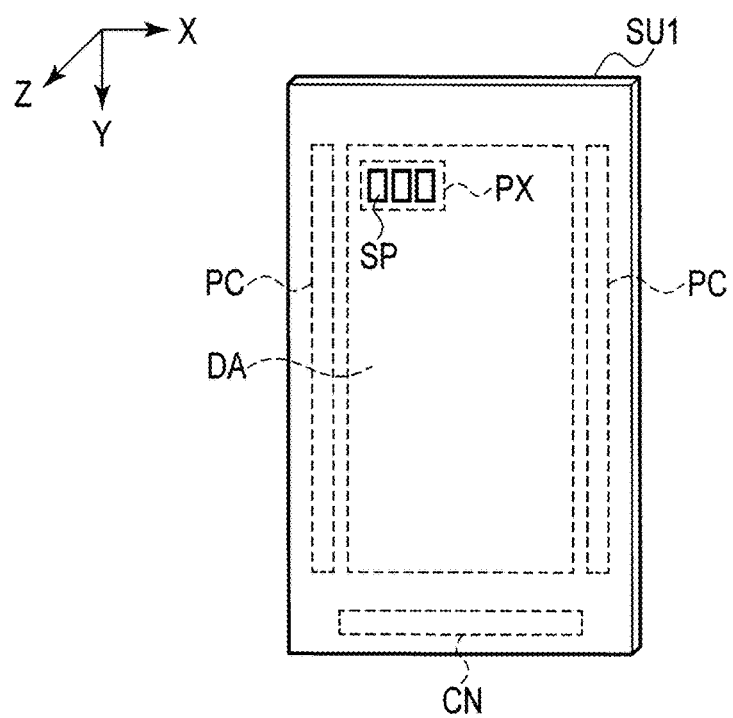
FIG. 2 is a perspective view which schematically illustrates an example of a first substrate of the first embodiment.

FIG. 2 is a perspective view which schematically illustrates an example of the first substrate SU'. The first substrate SU1 comprises a display area DA, and a pair of drive circuits PC arranged on the outer sides of the display area DA. The display area DA includes a large number of pixels PX arranged in the X direction and the Y direction. The pixel PX includes a plurality of sub-pixels SP which display red, green, and blue, for example. The pixel PX may include a sub-pixel SP which displays the other color such as white. The drive circuit PC supplies a signal (a scanning signal to be described later) for driving the sub-pixels SP.

Figure 3:
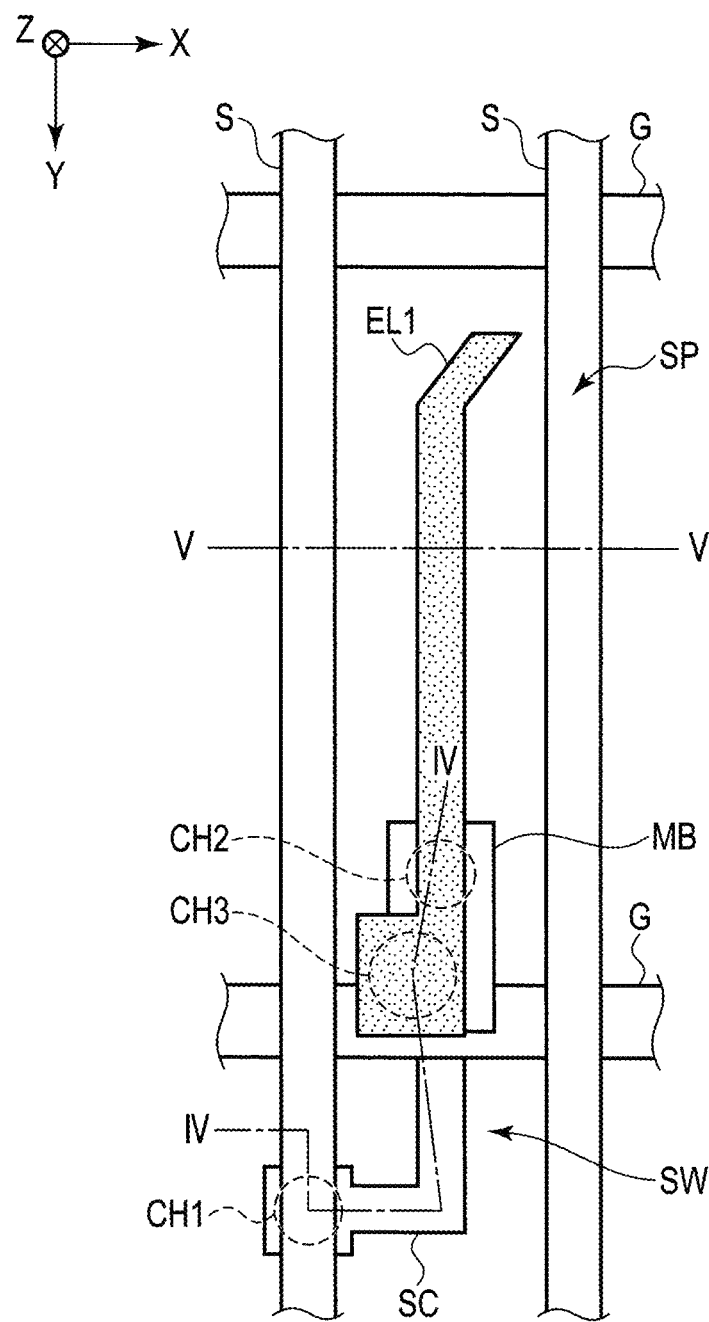
FIG. 3 is a plan view which schematically illustrates an example of a sub-pixel of the first embodiment.

FIG. 3 is a plan view which schematically illustrates an example of the sub-pixel SP. The first substrate SU1 comprises a plurality of scanning lines G, and a plurality of signal lines S. The plurality of scanning lines G extend in the X direction, and are arranged in the Y direction. The plurality of signal lines S extend in the Y direction, and are arranged in the X direction.

In the example of this figure, a region, which is delimited by two adjacent scanning lines G and two adjacent signal lines S, corresponds to a single sub-pixel SP. The first substrate SU1 comprises: a pixel electrode EL1 provided for each sub-pixel SP; a switching element SW; and a pedestal MB. In the example illustrated, the pixel electrode EL1 has a shape extending linearly. However, the pixel electrode EL1 may be shaped to extend linearly as described above, or may have a comb-teeth shape including a plurality of slits.

The switching element SW includes a semiconductor layer SC. The semiconductor layer SC can be formed of, for example, polysilicon, but is not limited to the aforementioned example. The semiconductor layer SC is extended while being bent, and intersects the scanning line G once. The semiconductor layer SC may intersect the scanning line G twice.

The pedestal MB overlaps the pixel electrode EL1 and the semiconductor layer SC as seen in plan view. In the example illustrated, the pedestal MB has a rectangular shape, but is not limited to the aforementioned example.

The signal line S is electrically connected to the semiconductor layer SC through a first contact hole CH1. The pedestal MB is electrically connected to the semiconductor layer SC through a second contact hole CH2. The pixel electrode EL1 is electrically connected to the pedestal MB through a third contact hole CH3.

Figure 4:
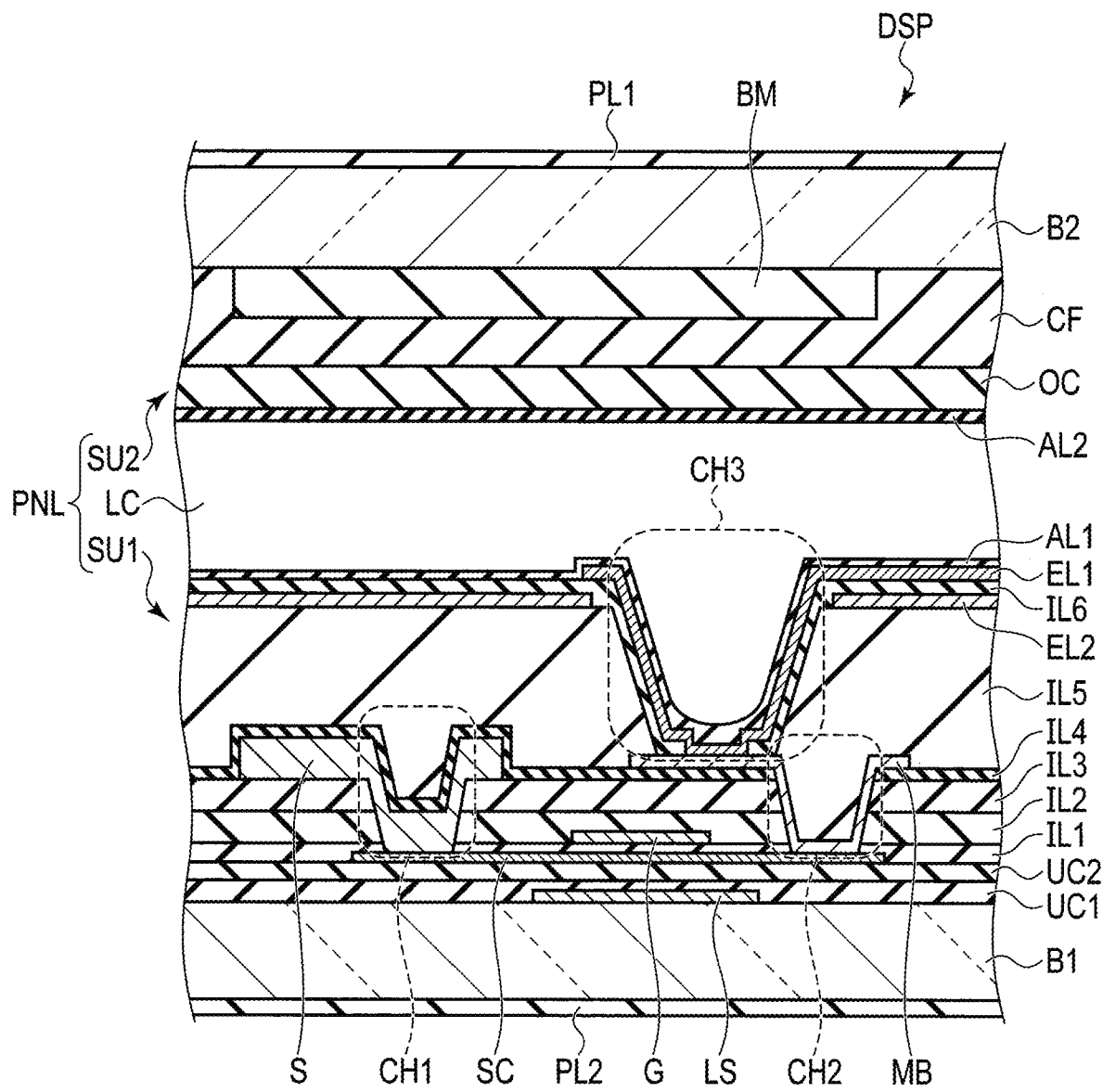
FIG. 4 is a schematic cross-sectional view of a display panel taken along line IV-IV of FIG. 3.
Figure 5:
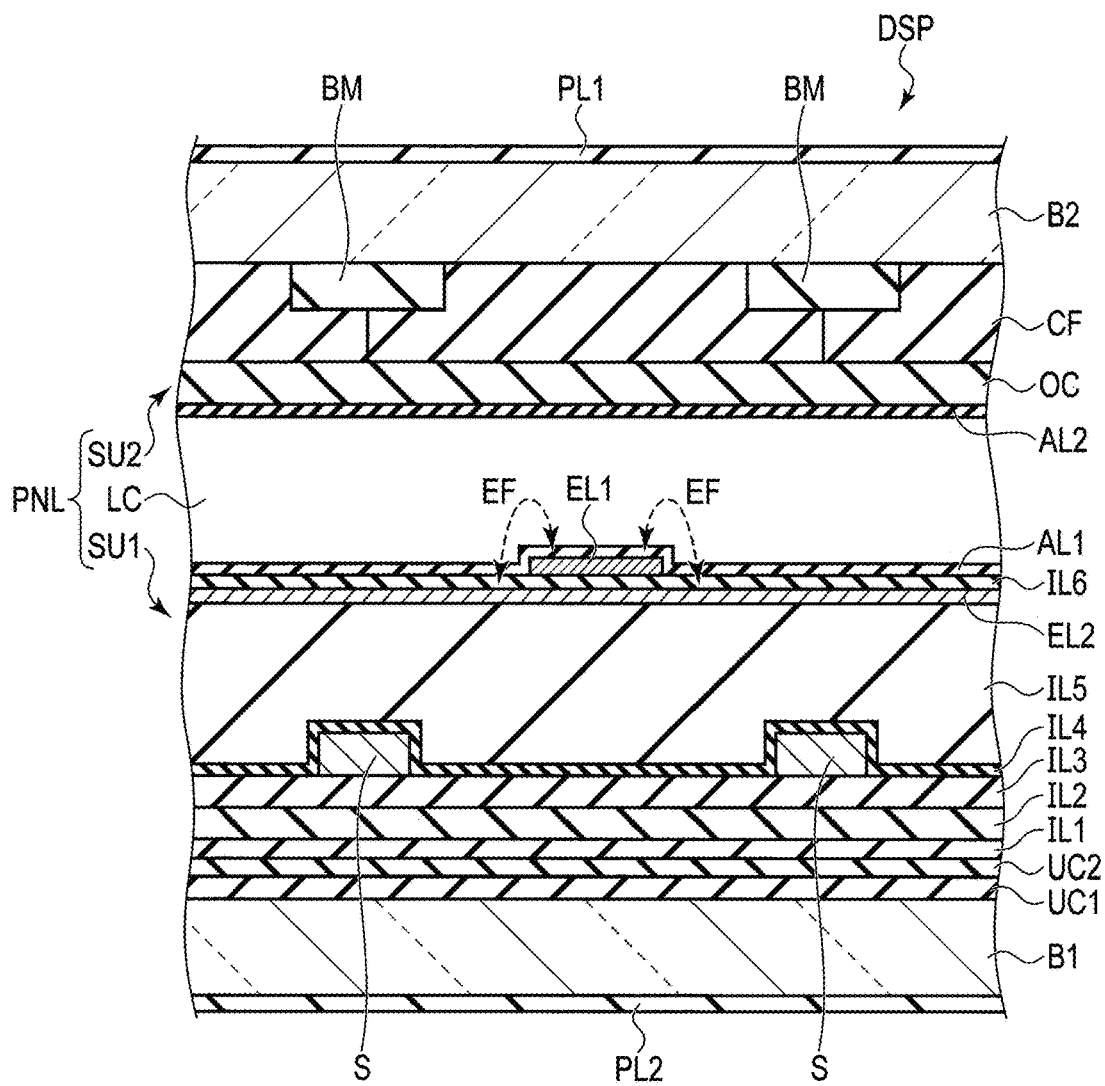
FIG. 5 is a schematic cross-sectional view of the display panel taken along line V-V of FIG. 3.

FIG. 4 is a schematic cross-sectional view of the display panel PNL taken along line IV-IV of FIG. 3. FIG. 5 is a schematic cross-sectional view of the display panel PNL taken along line V-V of FIG. 3. As shown in FIGS. 4 and 5, the first substrate SU1 comprises a first base B1, undercoat layers UC1 and UC2, insulating layers IL1 to IL6, an alignment film AL1, a light-shielding layer LS, the semiconductor layer SC, the scanning line G, the signal line S, the pixel electrode EL1, and a common electrode EL2.

The light-shielding layer LS is provided on an upper surface of the first base B1. The undercoat layer UC1 covers upper surfaces of the light-shielding layer LS and the first base B1. The undercoat layer UC2 covers the undercoat layer UC1. The semiconductor layer SC is provided on the undercoat layer UC2, and is opposed to the scanning line G. Further, a region, which is opposed to the scanning line G, of the semiconductor layer SC is opposed to the light-shielding layer LS. The insulating layer IL1 covers the semiconductor layer SC and the undercoat layer UC2. The scanning line G is provided on the insulating layer IL1. The insulating layer IL2 covers the scanning line G and the insulating layer IL1. The insulating layer IL3 covers the insulating layer IL2.

The signal line S is provided on the insulating layer IL3. The insulating layer IL4 covers the signal line S and the insulating layer IL3. The pedestal MB is provided on the insulating layer IL4. The insulating layer IL5 covers the pedestal MB and the insulating layer IL4. The common electrode EL2 is provided on the insulating layer IL5, and extends over a plurality of sub-pixel SP. The insulating layer IL6 covers the common electrode EL2 and the insulating layer IL5. The pixel electrode EL1 is provided on the insulating layer IL6. The alignment film AL1 covers the pixel electrode EL1 and the insulating layer IL6.

As shown in FIGS. 4 and 5, the second substrate SU2 comprises a second base B2, a black matrix BM (light-shielding layer), a color filter layer CF, an overcoat layer OC, and an alignment film AL2. The black matrix BM is provided on a lower surface of the second base B2, and is opposed to the scanning line G and the signal line S. The color filter layer CF covers the lower surfaces of the black matrix BM and the second base B2. The color filter layer CF comprises a plurality of color filters of colors corresponding to the respective sub-pixels SP. The black matrix BM may be provided below the color filter layer CF. The overcoat layer OC covers the color filter layer CF. The alignment film AL2 covers the overcoat layer OC.

The above-described liquid crystal layer LC is arranged between the alignment film AL1 and the alignment film AL2. The liquid crystal layer LC has the positive or negative dielectric anisotropy. The first polarizer PL1 is disposed on an upper surface of the second base B2. The second polarizer PL2 is disposed on a lower surface of the first base B1. Absorption axes of the first polarizer PL1 and the second polarizer PL2 are orthogonal to each other.

The first base B1 and the second base B2 can be made of borosilicate glass having a thickness of, for example, 0.2 mm or so. Alternatively, the first base B1 and the second base B2 may be made of resin such as polyimide. The alignment films AL1 and AL2 are polyimide films subjected to an optical alignment treatment, for example, but may be polyimide films subjected to a rubbing alignment treatment. The undercoat layer UC1 is, for example, a silicon oxide film, and the undercoat layer UC2 is, for example, a silicon-nitride film. The insulating layers IL1 and IL2 are, for example, silicon oxide films. The insulating layers IL3, IL4, and IL6 are, for example, silicon-nitride films. The insulating layer IL5 is, for example, a positive organic insulating film. The overcoat layer OC is, for example, a non-photo-sensitive organic film. The color filters of the respective colors included in the color filter layer CF are, for example, negative resists including pigments of the respective colors. The black matrix BM is, for example, a negative resist including a black pigment.

The pixel electrode EL1 and the common electrode EL2 can be formed of, for example, a transparent conductive material such as indium-tin-oxide (ITO). The scanning lines G and the light-shielding layer LS are made of, for example, molybdenum tungsten alloy. The semiconductor layer SC comprises polysilicon obtained from, for example, amorphous silicon, which is made to have a polycrystalline structure by a laser annealing method.

The signal line S is of a three-layer structure in which layers of titanium, aluminum, and titanium, for example, are stacked in order. Although the pedestal MB is of a single-layer structure made of titanium, for example, a multilayer structure may be employed instead. The thickness of the pedestal MB is less than the thickness of the signal line S. For example, the thickness of the pedestal MB is less than or equal to half the thickness of the signal line S. Also, for example, the thickness of the pedestal MB is 0.1 μm or more and 0.2 μm or less. In FIG. 4, although the thickness of the signal line S is greater than the thickness of the scanning line G, the thicknesses are not limited to those of the present example.

Note that the materials are not limited to those of each of the elements of the first substrate SU1 and the second substrate SU2 illustrated above, and each of the elements can be formed with various materials.

The first contact hole CH1 penetrates through the insulating layers IL1 to IL3. The second contact hole CH2 penetrates through the insulating layers IL1 to IL4. The third contact hole CH3 penetrates through the insulating layers IL5 and IL6. The signal line S is in contact with the semiconductor layer SC through the first contact hole CH1. The pedestal MB is in contact with the semiconductor layer SC through the second contact hole CH2. The pixel electrode EL1 is in contact with the pedestal MB through the third contact hole CH3.

As described above, in the present embodiment, the signal line S is electrically connected to the semiconductor layer SC through the first contact hole CH1 penetrating through a first insulating layer (the insulating layers IL1 to IL3), the pedestal MB is electrically connected to the semiconductor layer SC through the second contact hole CH2 penetrating through the first insulating layer, and the pixel electrode EL1 is electrically connected to the pedestal MB through the third contact hole CH3 penetrating through a second insulating layer (the insulating layers IL5 and IL6). Further, the first substrate SU1 comprises a third insulating layer (the insulating layer IL4) provided between the first insulating layer and the second insulating layer, and the second contact hole CH2 penetrates through the third insulating layer, in addition to the first insulating layer. At least a part of the signal line S (i.e., the part outside the first contact hole CH1) is located between the first insulating layer and the third insulating layer, and at least a part of the pedestal MB (i.e., the part outside the second contact hole CH2) is located between the third insulating layer and the second insulating layer. That is, in the present embodiment, the signal line S and the pedestal MB are provided in layers different from each other.

Since the transparent conductive material such as ITO has low adherence to the semiconductor layer SC, conduction failure may occur if a structure in which the pixel electrode EL1 and the semiconductor layer SC are directly connected is employed. In contrast, in the present embodiment, the pedestal MB made of metal is interposed between the pixel electrode EL1 and the semiconductor layer SC. Since the adherence between the pixel electrode EL1 and the pedestal MB, and the adherence between the pedestal MB and the semiconductor layer SC are both good, the conduction failure as mentioned above can be suppressed.

A common voltage is applied to the common electrode EL2. When a scanning signal is supplied to the scanning line G, and a video signal is supplied to the signal line S, the video signal is applied to the pixel electrode EL1 via the semiconductor layer SC and the pedestal MB. As shown in FIG. 5, a fringing field EF is produced on the basis of a potential difference between the pixel electrode EL1 and the common electrode EL2. The fringing field EF acts on the liquid crystal layer LC, and rotates liquid crystal molecules included in the liquid crystal layer LC from an initial alignment direction. The display device DSP may adopt a normally black mode whereby the sub-pixels SP affected by the fringing field EF serve to perform bright display, or adopt a normally white mode whereby the sub-pixels SP affected by the fringing field EF serve to perform dark display.

The structure of the display panel PNL is not limited to that of the examples shown in FIGS. 4 and 5. For example, the pixel electrode EL1 and the common electrode EL2 may be arranged in the same layer, or the common electrode EL2 may be arranged between the liquid crystal layer LC and the pixel electrode EL'. Also, the display panel PNL may adopt a mode which uses a longitudinal electric field which is parallel to the Z direction, instead of the fringing field EF. In this case, the common electrode EL2 is arranged on the second substrate SU2. Other than the above, various modes can be applied to the display panel PNL.

Figure 6A:
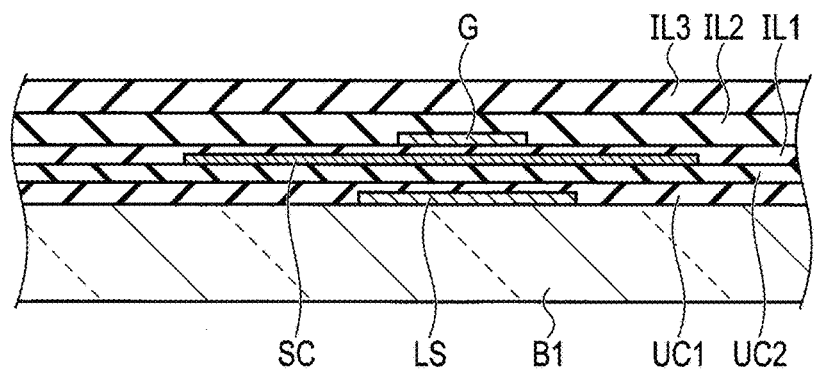
FIG. 6A is a schematic cross-sectional view showing a manufacturing process of the first substrate of the first embodiment.

Here, an example of a manufacturing process of the first substrate SU1 will be described. FIG. 6A to FIG. 6F are schematic cross-sectional views showing the manufacturing process of the first substrate SU1. In FIG. 6A, the undercoat layers UC1 and UC2, the insulating layers IL1 to IL3, the light-shielding layer LS, the semiconductor layer SC, and the scanning line G are formed on the first base B1.

Figure 6B:
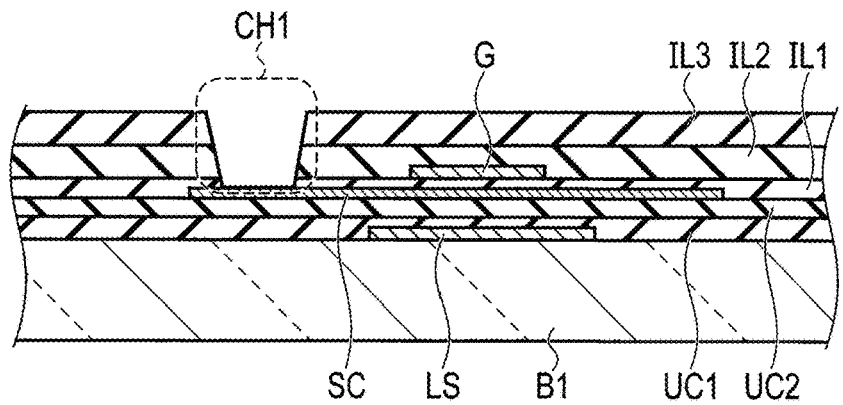
FIG. 6B is a schematic cross-sectional view showing the manufacturing process subsequent to FIG. 6A.
Figure 6C:
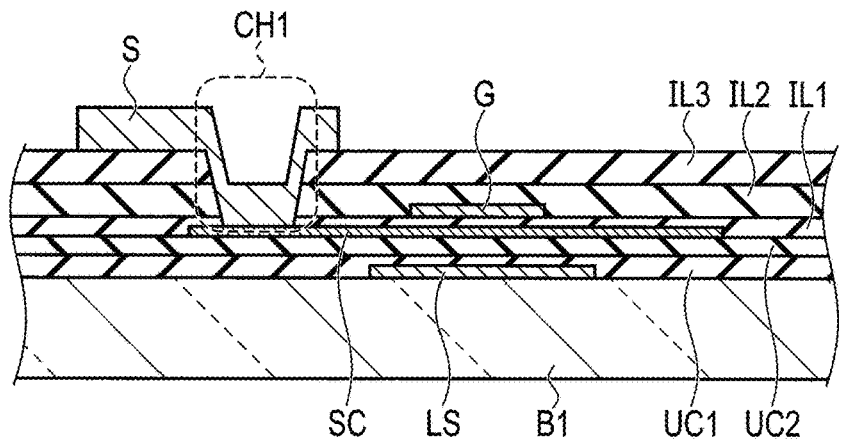
FIG. 6C is a schematic cross-sectional view showing the manufacturing process subsequent to FIG. 6B.

In FIG. 6B, the first contact hole CH1 penetrating through the insulating layers IL1 to IL3 is formed. In this state, a part of the semiconductor layer SC is exposed through the first contact hole CH1. In FIG. 6C, the signal line S is formed to pass through the first contact hole CH1. The signal line S is thereby in contact with the semiconductor layer SC through the first contact hole CH1.

Figure 6D:
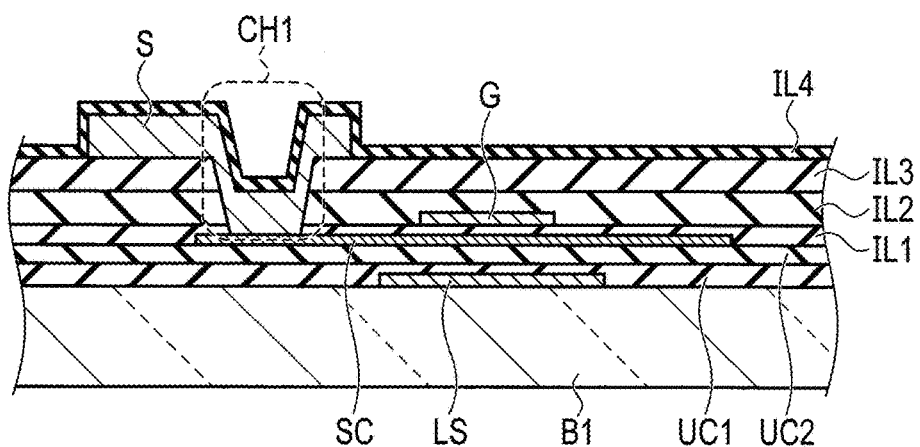
FIG. 6D is a schematic cross-sectional view showing the manufacturing process subsequent to FIG. 6C.

In FIG. 6D, the insulating layer IL4, which covers the signal line S and the insulating layer IL3, is formed. In FIG. 6E, the second contact hole CH2 penetrating through the insulating layers IL1 to IL4 is formed. In this state, a part of the semiconductor layer SC is exposed through the second contact hole CH2.

In FIG. 6F, the pedestal MB is formed so as to cover the second contact hole CH2. The pedestal MB comes into contact with the semiconductor layer SC through the second contact hole CH2. After that, the insulating layer IL5, the common electrode EL2, the insulating layer IL6, the pixel electrode EL1, and the alignment film AL1 are formed in order, and the first substrate SU1 shown in FIG. 4 is completed.

As described above, in the present embodiment, the signal line S and the pedestal MB which function as a source electrode and a drain electrode of the switching element SW including the semiconductor layer SC, respectively, are formed by different manufacturing processes and in different layers with different materials.

Figure 7:
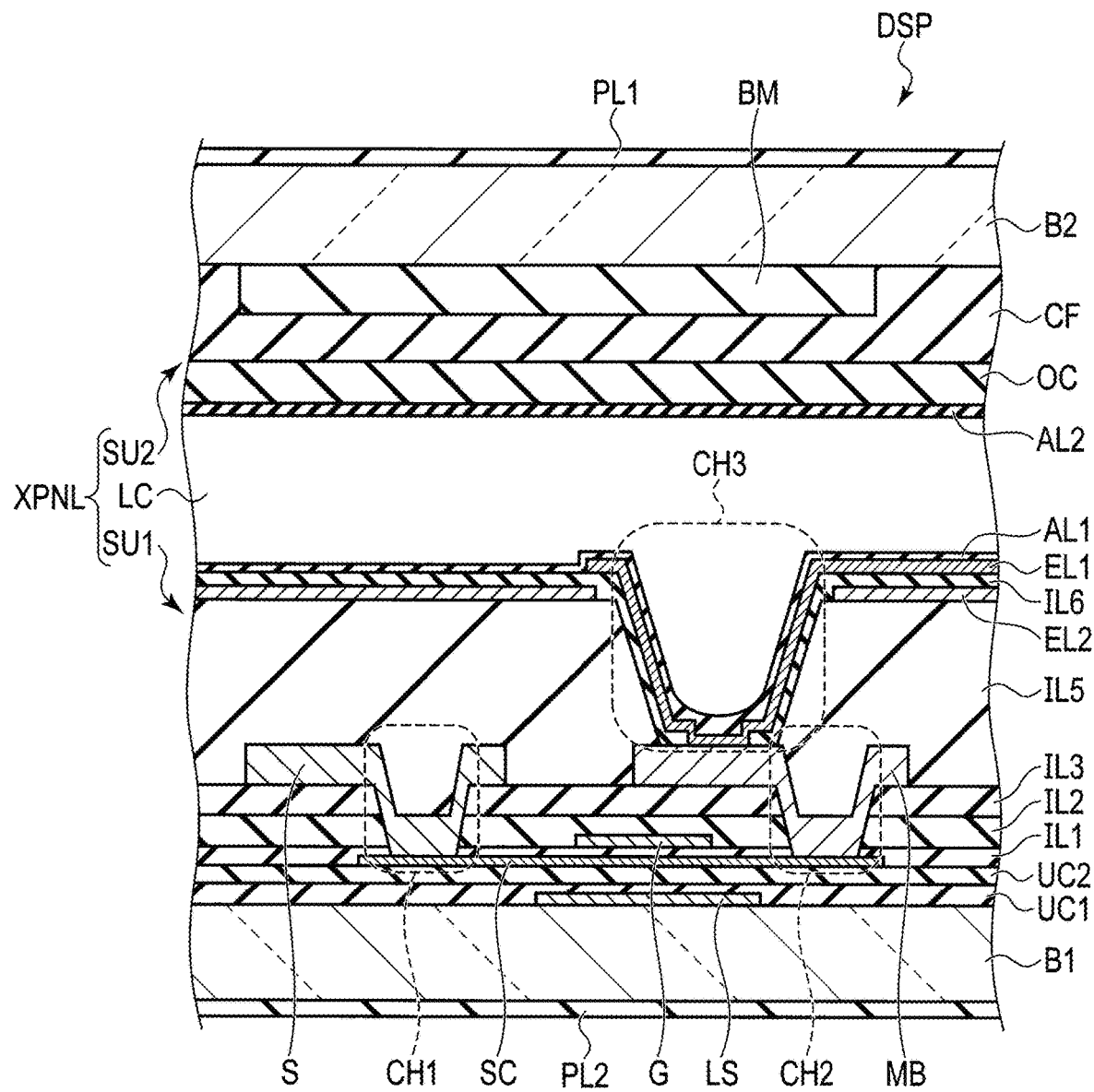
FIG. 7 is a schematic cross-sectional view of a display panel according to a comparative example.

Here, an advantage of the present embodiment will be described below. FIG. 7 is a schematic cross-sectional view of a display panel XPNL according to a comparative example for comparison with the present embodiment. The display panel XPNL is different from the display panel PNL according to the present embodiment shown in FIG. 4 in that the pedestal MB is provided in the same layer as that of the signal line S, and that no insulating layer IL4 is provided. The pedestal MB is formed of the same material as that of the signal line S in the same manufacturing process. Therefore, in the display panel XPNL, the thickness of the pedestal MB is the same as the thickness of the signal line S.

Figure 8:
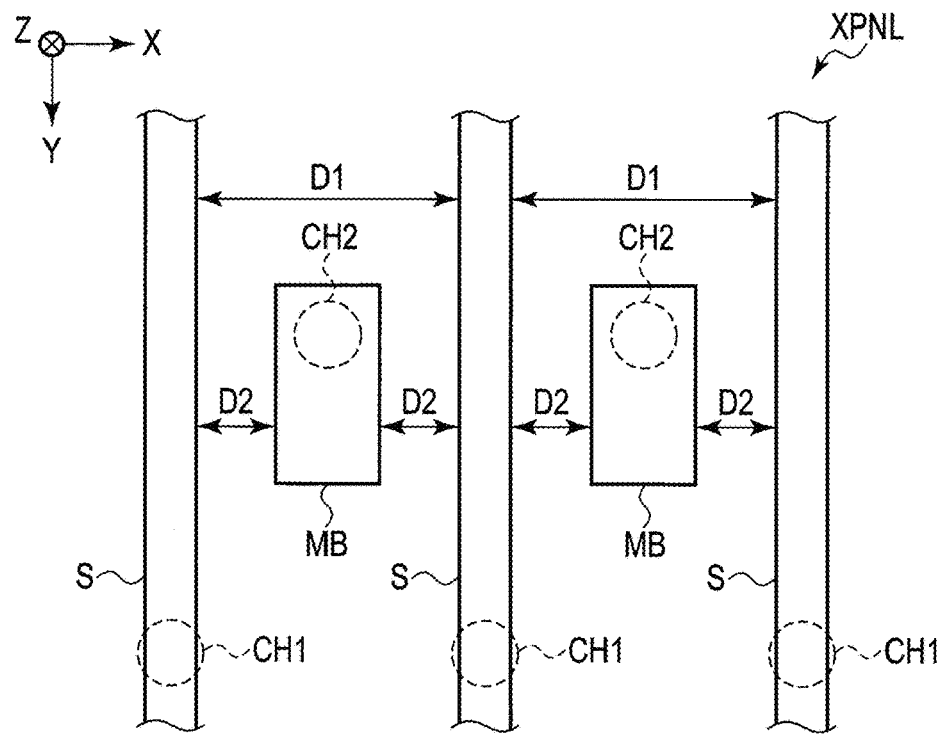
FIG. 8 is a schematic plan view of elements provided in the display panel according to the comparative example.

FIG. 8 is a schematic plan view of a signal line S, a pedestal MB, a first contact hole CH1, and a second contact hole CH2 provided in the display panel XPNL. In order to realize highly fine sub-pixels SP, it is necessary to make a distance D1 between adjacent signal lines S small. However, in the comparative example, the signal line S and the pedestal MB are formed in the same layer. For this reason, a sufficient distance D2 between the signal line S and the pedestal MB must be secured in order to prevent a short circuit between the two. If the sub-pixels SP are to be made highly fine by making the distance D2 extremely small, extremely high processing accuracy is required, which imposes limitations on improving the fineness.

Further, it is necessary to increase the thickness of the signal line S to prevent a signal delay in the signal line S. In an electronic device such as a VR viewer, in particular, a moving image display capability may be enhanced by increasing a drive frequency, and suppressing of the signal delay is greatly required in such a situation. In the comparative example, when the thickness of the signal line S is increased, the thickness of the pedestal MB is also increased, and thus improvement of the processing accuracy of these elements becomes more difficult.

Figure 9:
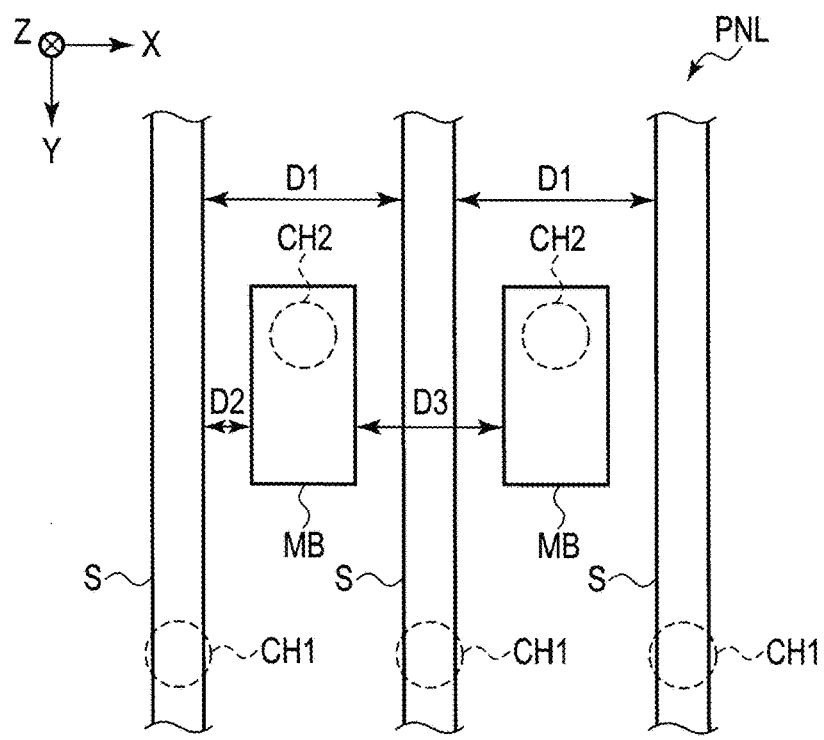
FIG. 9 is a schematic plan view of elements provided in the display panel according to the first embodiment.

FIG. 9 is a schematic plan view of the signal line S, the pedestal MB, the first contact hole CH1, and the second contact hole CH2 provided in the display panel PNL according to the present embodiment. In the present embodiment, the signal line S and the pedestal MB are formed in different layers. Therefore, even if a distance D2 is reduced, a short circuit between the aforementioned two elements does not occur. Also, even if the thickness of the signal line S is increased, processing accuracy as high as that required in the comparative example is not required.

In the case of the present embodiment, a distance D1 between adjacent signal lines S, and a distance D3 between adjacent pedestals MB become factors which determine the fineness of the sub-pixels SP. For example, it is assumed that the diameter of the second contact hole CH2 is 2.0 μm, and the width of the pedestal MB in the X direction is 3.0 μm so that the entire second contact hole CH2 can be covered. Further, when it is assumed that the width of the signal line S in the X direction is 1.5 μm, and the distance D2 is set to such a small value as 1.5 μm, the width of the sub-pixel SP in the X direction is 7.5 μm. The above corresponds to a high fineness of 1100 ppi or more.

As described above, in the present embodiment, the sub-pixels SP can be made highly fine by forming the pedestal MB in a layer different from that of the signal line S. Further, since the advantage of achieving the high fineness can be obtained even if the signal line S is made thick, suppression of the signal delay in the signal line S is also possible. Furthermore, since the pedestal MB is thinner than the signal line S, unevenness caused by the pedestal MB is less likely to occur.

Second Embodiment

A second embodiment will be described. Structures similar to those of the first embodiment can be applied to structures not particularly mentioned.

FIG. 10 is a schematic cross-sectional view of a display panel PNL provided in a display device DSP according to the present embodiment. The display panel PNL shown in FIG. 10 is different from the display panel PNL shown in FIG. 4 in that the display panel PNL of FIG. 10 further comprises a wiring connection layer SE and an insulating layer IL7 (a fourth insulating layer), and that no insulating layer IL4 is provided.

For example, the wiring connection layer SE can be formed in the same layer as that of a pedestal MB, and with the same material as that of the pedestal MB. The wiring connection layer SE is of a single-layer structure made of titanium, for example, but is not limited to the aforementioned example. The wiring connection layer SE covers a first contact hole CH1, and is electrically connected to a semiconductor layer SC through the first contact hole CH1.

The thicknesses of the wiring connection layer SE and the pedestal MB are smaller than the thickness of a signal line S. For example, the thickness of each of the wiring connection layer SE and the pedestal MB is less than or equal to half the thickness of the signal line S. Also, for example, the thickness of each of the wiring connection layer SE and the pedestal MB is 0.1 μm or more and 0.2 μm or less.

The insulating layer IL7 is provided between insulating layers IL3 and IL5, and covers the pedestal MB and the insulating layer IL3. The insulating layer IL7 also covers a part of the wiring connection layer SE. The first contact hole CH1 penetrates through the insulating layer IL7, in addition to insulating layer IL2 and IL3. The signal line S is provided on the insulating layer IL7, and is in contact with the wiring connection layer SE at the first contact hole CH1. As described above, the signal line S and the semiconductor layer SC are electrically connected to each other through the first contact hole CH1, and also via the wiring connection layer SE.

A third contact hole CH3 penetrates through the insulating layer IL7, in addition to the insulating layer IL5. A pixel electrode EL1 is electrically connected to the pedestal MB through the third contact hole CH3.

Here, an example of the manufacturing process of a first substrate SU1 of the present embodiment will be described. FIG. 11A to FIG. 11F are schematic cross-sectional views showing the manufacturing process of the first substrate SU1. FIG. 12A to FIG. 12C are schematic plan views showing the manufacturing process of the first substrate SU1'.

Figure 11A:
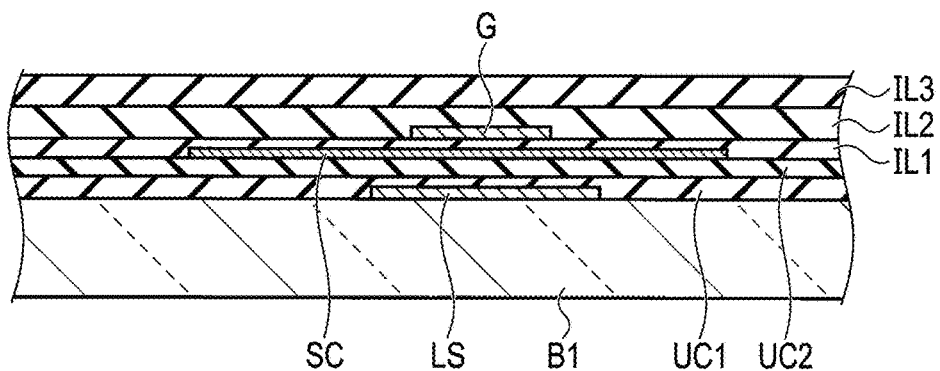
FIG. 11A is a schematic cross-sectional view showing a manufacturing process of a first substrate of the second embodiment.
Figure 11B:
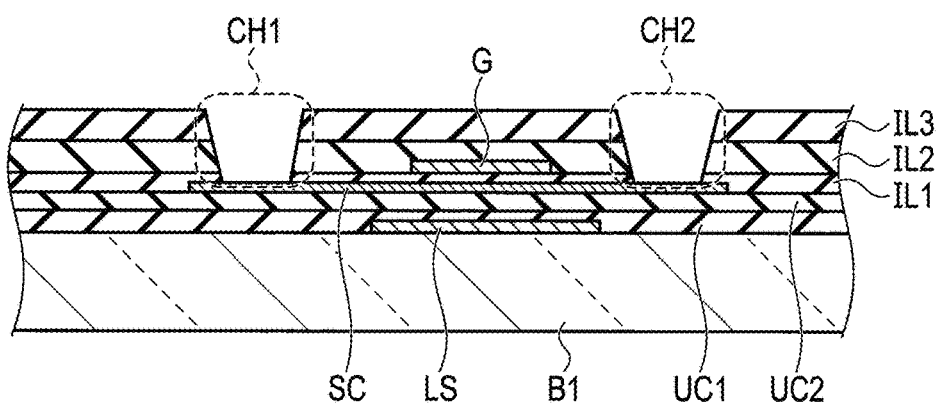
FIG. 11B is a schematic cross-sectional view showing the manufacturing process subsequent to FIG. 11A.
Figure 12B:
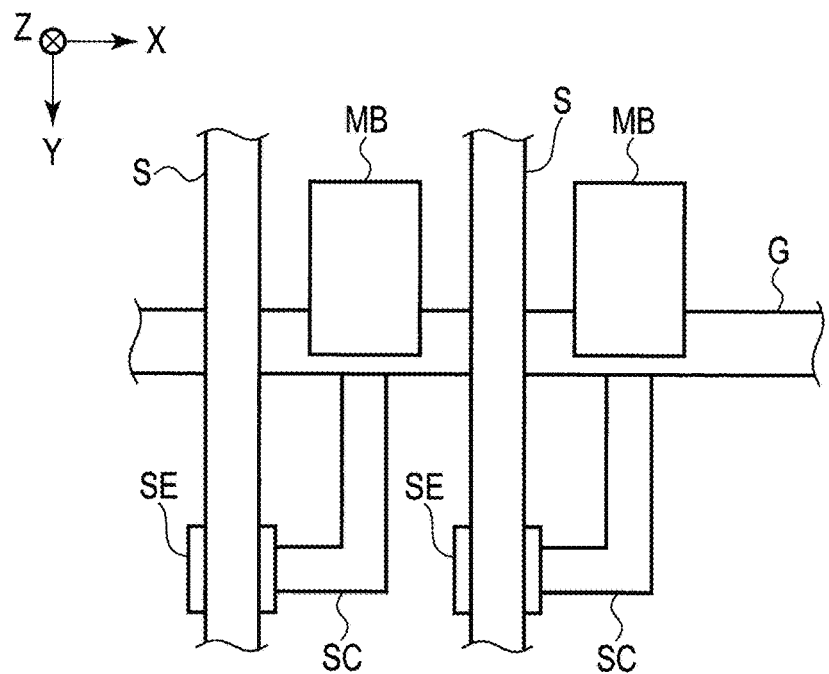
FIG. 12B is a schematic plan view showing the manufacturing process subsequent to FIG. 12A.
Figure 12C:
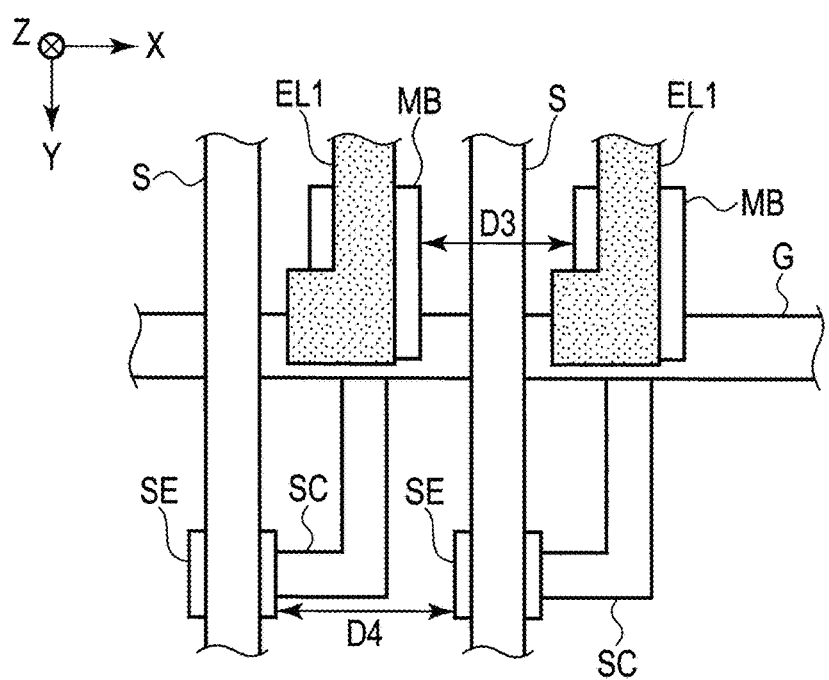
FIG. 12C is a schematic plan view showing the manufacturing process subsequent to FIG. 12B.

In FIG. 11A, undercoat layers UC1 and UC2, insulating layers IL1 to IL3, a light-shielding layer LS, the semiconductor layer SC, and a scanning line G are formed on a first base B1. In FIG. 11B, the first contact hole CH1 and a second contact hole CH2, which both penetrate through the insulating layers IL1 to IL3, are formed. The first contact hole CH1 and the second contact hole CH2 can be formed simultaneously in the same process.

Figure 11C:
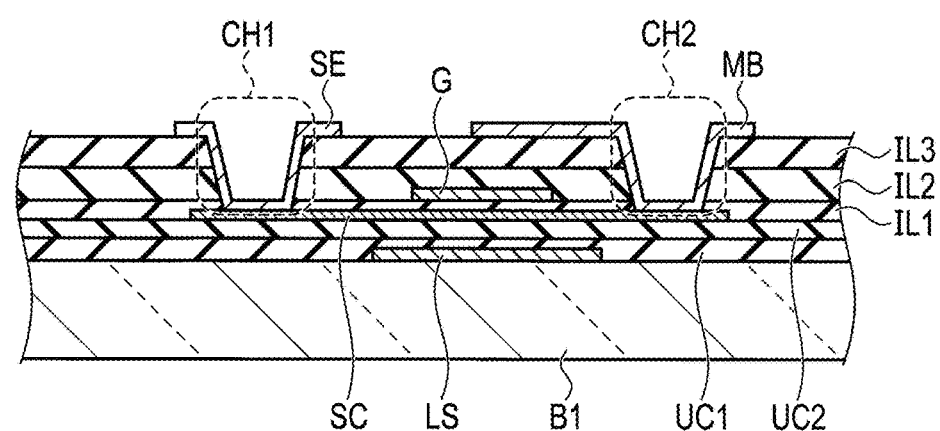
FIG. 11C is a schematic cross-sectional view showing the manufacturing process subsequent to FIG. 11B.

In FIG. 11C, the wiring connection layer SE and the pedestal MB are formed by, for example, patterning a titanium film that is formed on the insulating layer IL3 overall. The wiring connection layer SE comes into contact with the semiconductor layer SC through the first contact hole CH1, and the pedestal MB comes into contact with the semiconductor layer SC through the second contact hole CH2. For example, as shown in FIG. 12A, the positions of the wiring connection layer SE and the pedestal MB in the Y direction are not aligned. The area of the wiring connection layer SE is smaller than the area of the pedestal MB, but is not limited to the area of the aforementioned example.

Figure 11D:
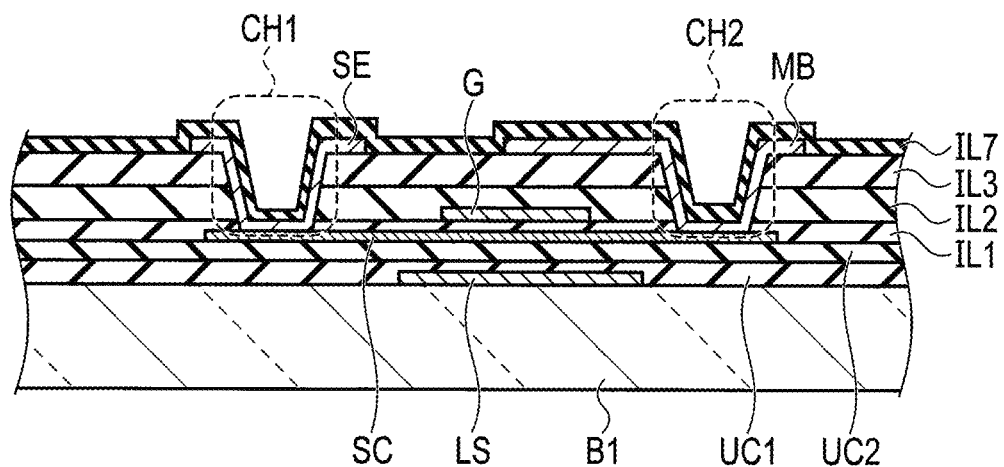
FIG. 11D is a schematic cross-sectional view showing the manufacturing process subsequent to FIG. 11C.
Figure 11E:
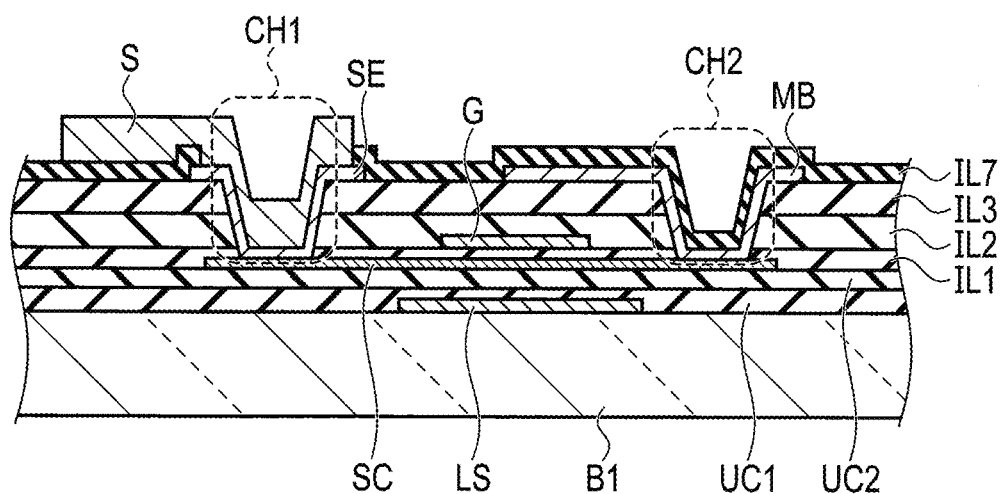
FIG. 11E is a schematic cross-sectional view showing the manufacturing process subsequent to FIG. 11D.

In FIG. 11D, the insulating layer IL7, which covers the insulating layer IL3, the wiring connection layer SE, and the pedestal MB, is formed. In FIG. 11E, by allowing the insulating layer IL7 to be open above the wiring connection layer SE, the first contact hole CH1 penetrating through the insulating layers IL1 to IL3 and IL7 is completed, and the signal line S is also formed. As shown in FIG. 12B, the signal line S is formed to pass through the wiring connection layer SE.

In FIG. 11F, the insulating layer IL5, a common electrode EL2, and an insulating layer IL6 are formed in order above the insulating layer IL7 and the signal line S, and the third contact hole CH3 penetrating through the insulating layers IL5 to IL7 is formed. After that, by forming the pixel electrode EL1 as shown in FIG. 12C, and further forming an alignment film AL1, the first substrate SU1 as shown in FIG. 10 is completed.

The wiring connection layer SE and the pedestal MB are both island-shaped, as shown in FIGS. 12A to 12C, and the positions of the wiring connection layer SE and the pedestal MB in the Y direction are not aligned. Accordingly, even if a distance D3 (FIG. 12C) between the pedestals MB that are adjacent to each other in the X direction, and a distance D4 (similarly, FIG. 12C) between the wiring connection layers SE that are adjacent to each other in the X direction are reduced, the wiring connection layer SE and the pedestal MB are not short-circuited.

Furthermore, in the present embodiment, the first contact hole CH1 and the second contact hole CH2 are formed simultaneously. Therefore, as compared to a case where the two are formed in separate processes, the positional accuracy of the two can be improved. Consequently, designing of highly fine sub-pixels SP is facilitated.

For example, it is assumed that the diameter of each of the first contact hole CH1 and the second contact hole CH2 is 2.0 μm. Further, the width of the wiring connection layer SE in the X direction is set to 3.0 μm so that the entire first contact hole CH1 can be covered, and the width of the pedestal MB in the X direction is set to 3.0 μm so that the entire second contact hole CH2 can be covered. If the distances D3 and D4 are both set to 3.0 μm, a repetition interval of the wiring connection layer SE and a repetition interval of the pedestal MB are both 6.0 μm. In this case, the width of the sub-pixel SP in the X direction is equal to 6.0 µm. The above corresponds to a high fineness of 1400 ppi or more.

Note that the widths of the wiring connection layer SE and the pedestal MB in the X direction are not limited to those of the above example, and can be defined as appropriate within a range from 2.0 µm to 3.0 µm, for example.

Third Embodiment

A third embodiment will be described. Structures similar to those of each of the embodiments described above can be applied to structures not particularly mentioned.

Figure 13:
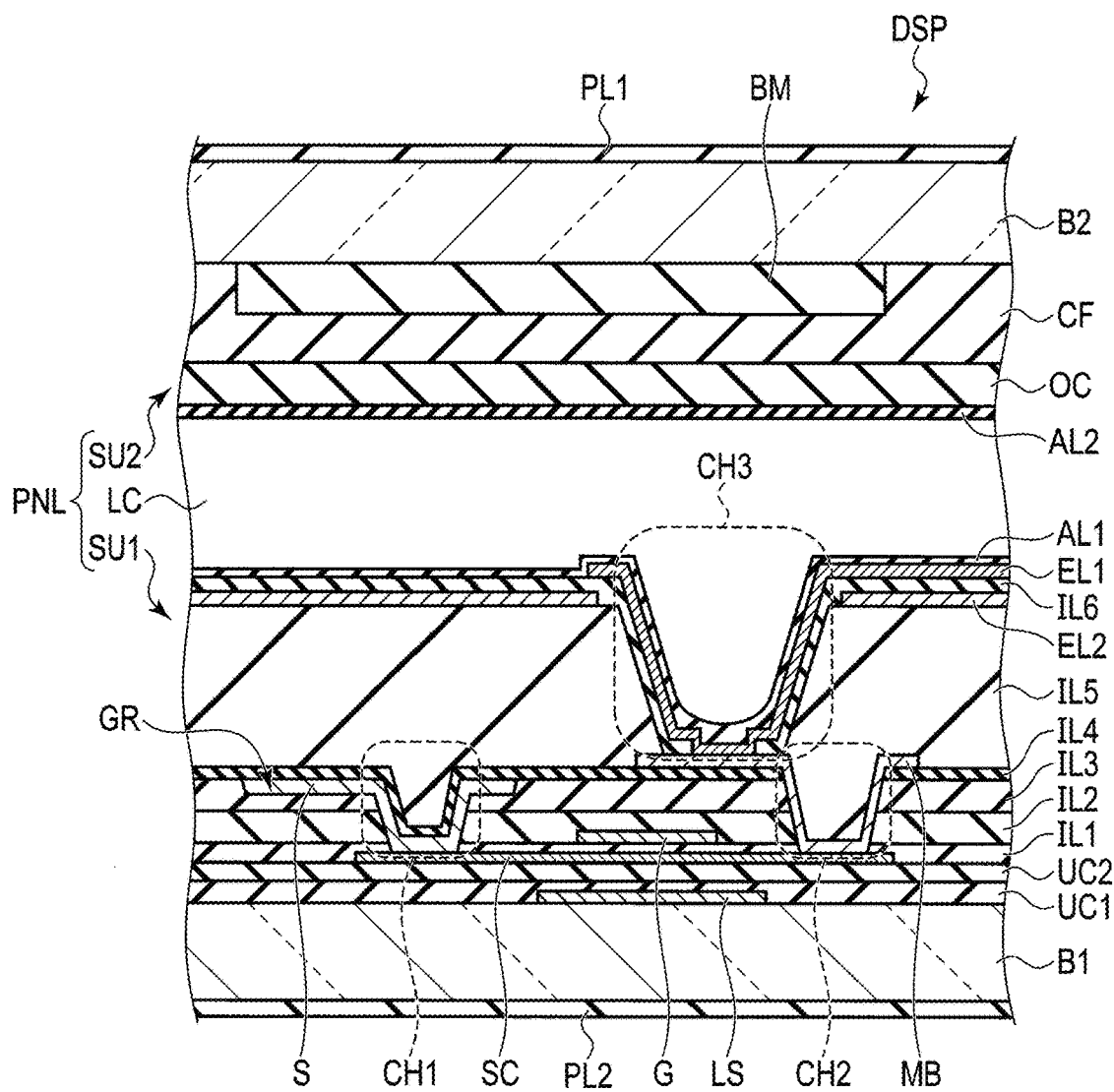
FIG. 13 is a schematic cross-sectional view of a display panel provided in a display device according to a third embodiment.

FIG. 13 is a schematic cross-sectional view of a display panel PNL provided in a display device DSP according to the present embodiment. The display panel PNL shown in FIG. 13 is different from the display panel PNL shown in FIG. 4 in that a signal line S is formed in a groove GR provided on an insulating layer IL3, and is made thin.

A first contact hole CH1 is provided from a bottom surface of the groove GR to an upper surface of a semiconductor layer SC. The signal line S is formed of copper or an alloy containing copper, and is of a single-layer structure. For example, an upper surface of the signal line S is a plane that is continuous with an upper surface of the insulating layer IL3 around the groove GR, except for the location of the first contact hole CH1. However, the upper surface of the signal line S may be located above the upper surface of the insulating layer IL3 around the groove GR, or may be located below the upper surface of the insulating layer IL3. In FIG. 13, the thickness of the signal line S is slightly greater than the thickness of a pedestal MB. However, the thickness of the signal line S may be less than or equal to the thickness of the pedestal MB.

Figure 14A:
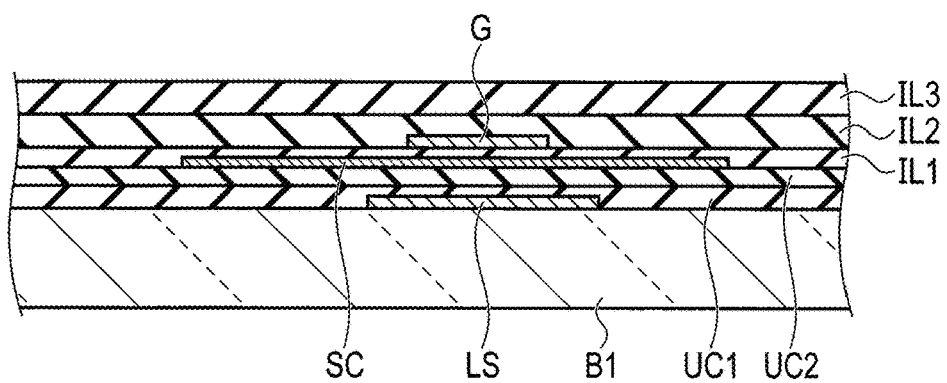
FIG. 14A is a schematic cross-sectional view showing a manufacturing process of a first substrate of the third embodiment.

Here, an example of the manufacturing process of a first substrate SU1 of the present embodiment will be described. FIG. 14A to FIG. 14H are schematic cross-sectional views showing the manufacturing process of the first substrate SU1. In FIG. 14A, undercoat layers UC1 and UC2, insulating layers IL1 to IL3, a light-shielding layer LS, a semiconductor layer SC, and a scanning line G are formed on a first base B1.

Figure 14B:
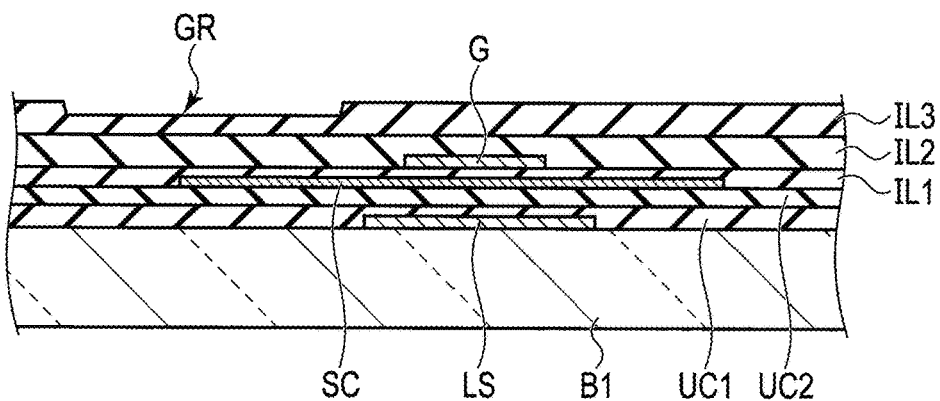
FIG. 14B is a schematic cross-sectional view showing the manufacturing process subsequent to FIG. 14A.

In FIG. 14B, the groove GR is formed on the upper surface of the insulating layer IL3. The groove GR has a planar shape similar to that of the signal line S. Such a groove GR can be formed by partially reducing the thickness of the insulating layer IL3 by patterning using, for example, a halftone mask.

Figure 14C:
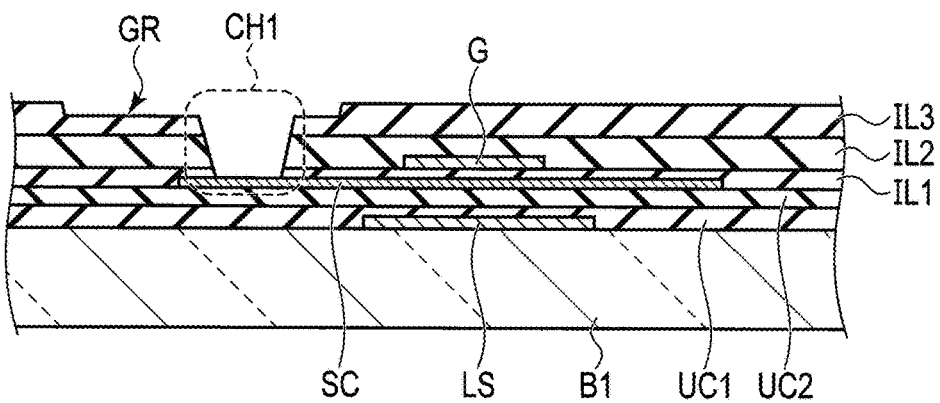
FIG. 14C is a schematic cross-sectional view showing the manufacturing process subsequent to FIG. 14B.
Figure 14D:
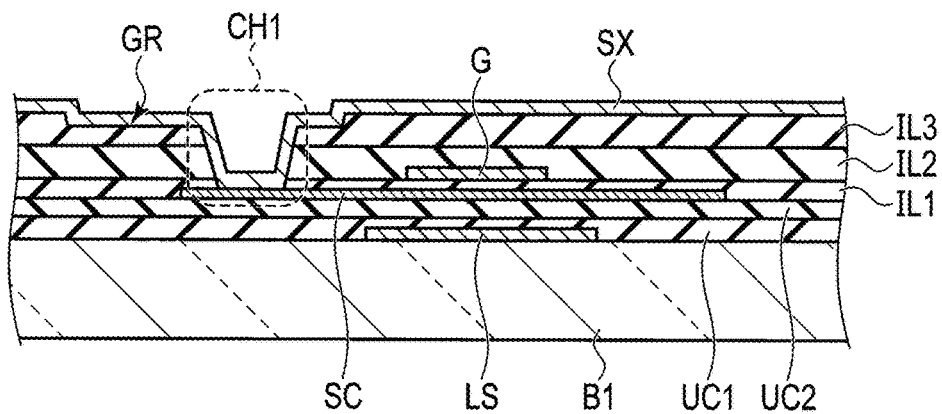
FIG. 14D is a schematic cross-sectional view showing the manufacturing process subsequent to FIG. 14C.

In FIG. 14C, the first contact hole CH1 is formed at a position overlapping the groove GR. In FIG. 14D, a continuous copper film SX is formed on the insulating layer IL3 and inside the first contact hole CH1.

In FIG. 14E, the signal line S is formed by, for example, mechanically scraping off the copper film SX outside the groove GR. As described above, in the present embodiment, the signal line S is formed by a damascene method. However, the signal line S may be formed by the other method.

In FIG. 14F, an insulating layer IL4, which covers the signal line S and the insulating layer IL3, is formed. In FIG. 14G, a second contact hole CH2 penetrating through the insulating layers IL1 to IL4 is formed. In FIG. 14H, the pedestal MB is formed so as to cover the second contact hole CH2. The pedestal MB comes into contact with the semiconductor layer SC through the second contact hole CH2. After that, an insulating layer IL5, a common electrode EL2, an insulating layer IL6, a pixel electrode EL1, and an alignment film AL1 are formed in order, and the first substrate SU1 shown in FIG. 13 is completed.

The resistance of copper is approximately 60% of the resistance of aluminum. Further, there is no need to form a titanium film on the upper and lower sides because copper is thermally stable. Therefore, in the present embodiment, even if the thickness of the signal line S is made less than or equal to half the thickness relative to each of the embodiments described above, the signal delay as mentioned above can be suitably suppressed.

When the signal line S is formed in the groove GR as shown in FIG. 13, unevenness of the insulating layer IL4 that is above the signal line S is suppressed. For example, in the example shown in FIG. 4, the insulating layer IL4 is protruded above the signal line S. In this case, the pedestal MB is to be arranged between protruding portions caused by the signal lines S that are adjacent to each other in the X direction. Meanwhile, if the insulating layer IL4 is flat above the signal line S as shown in FIG. 13, the signal line S and the pedestal MB can be arranged closer to each other, and it becomes possible to make the sub-pixels SP even more finer.

Fourth Embodiment

A fourth embodiment will be described. Structures similar to those of each of the embodiments described above can be applied to structures not particularly mentioned.

FIG. 15 is a schematic cross-sectional view of a display panel PNL provided in a display device DSP according to the present embodiment. In the display device DSP according to the present embodiment, the basic structure is similar to that of the example shown in FIG. 10, but a signal line S is formed of copper or an alloy containing copper.

As described above, since the resistance of copper is low, the signal line S of the present embodiment has a smaller thickness as compared to the example of FIG. 10. In FIG. 15, the thickness of the signal line S is slightly greater than the thicknesses of a wring line connection layer SE and a pedestal MB. However, the thickness of the signal line S may be less than or equal to the thicknesses of the wiring connection layer SE and the pedestal MB.

The manufacturing process of a first substrate SU1 is the same as that described with reference to FIGS. 11A to 11F. In the present embodiment, a first contact hole CH1 and a second contact hole CH2 are formed simultaneously. Therefore, if a groove for the damascene method is to be provided, the first contact hole CH1 is etched excessively. The same occurs even if the order of formation of the groove and the first contact hole CH1 is reversed. Hence, the signal line S can be formed by, for example, wet etching.

Even with the configuration of the present embodiment, the thickness of the signal line S can be reduced. Accordingly, it is possible to arrange the signal line S and the pedestal MB closer to each other as in the third embodiment, and make the sub-pixels SP highly fine.

Fifth Embodiment

A fifth embodiment will be described. Structures similar to those of each of the embodiments described above can be applied to structures not particularly mentioned.

Figure 16:
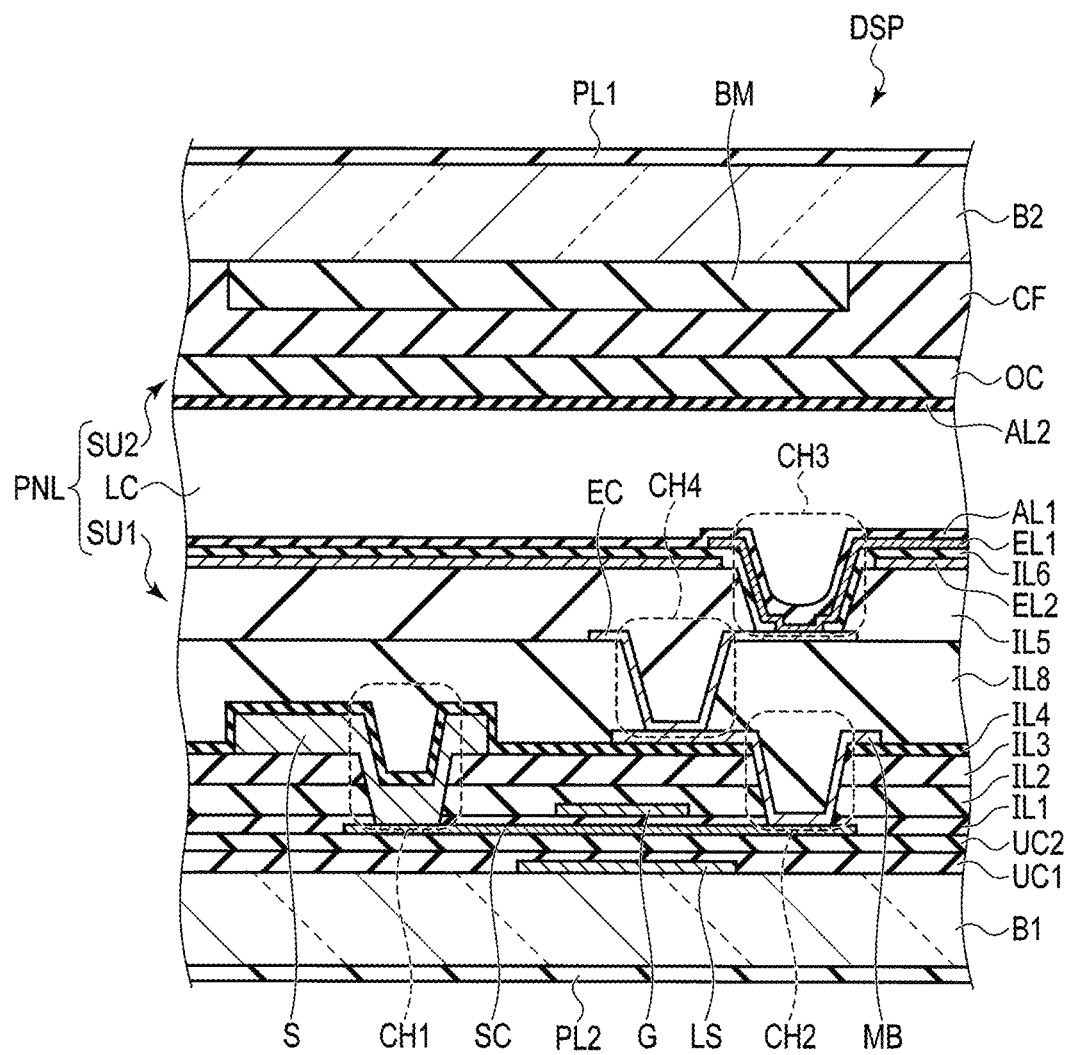
FIG. 16 is a schematic cross-sectional view of a display panel provided in a display device according to a fifth embodiment.

FIG. 16 is a schematic cross-sectional view of a display panel PNL provided in a display device DSP according to the present embodiment. FIG. 17 is a schematic cross-sectional view of the display panel PNL at a position different from FIG. 16. The display panel PNL shown in FIGS. 16 and 17 is different from the display panel PNL shown in FIGS. 4 and 5 in that the display panel PNL of FIGS. 16 and 17 further comprises an insulating layer IL8 (a fifth insulating layer), and an electrode connection layer EC.

The insulating layer IL8 is provided between insulating layers IL4 and IL5, and covers a pedestal MB and the insulating layer IL4. The insulating layer IL8 is, for example, a positive organic insulating film, but is not limited to the aforementioned example. The electrode connection layer EC is provided on the insulating layer IL8, and is electrically connected to the pedestal MB through a fourth contact hole CH4 penetrating through the insulating layer IL8. The electrode connection layer EC and the insulating layer IL8 are covered with the insulating layer IL5. A pixel electrode EL1 is electrically connected to the electrode connection layer EC through a third contact hole CH3. The electrode connection layer EC can be formed of, for example, a transparent conductive material such as ITO.

Generally, in a contact hole which penetrates through an insulating layer, the thicker the insulating layer is, the greater the difference in dimension between a top part and a bottom part becomes. Accordingly, in a case where the insulating layer is thick, if a sufficient bottom part area of the contact hole is to be secured, the top part area is also increased. In other words, by thinning the insulating layer, the top part area of the contact hole can be reduced, which is advantageous in achieving high fineness.

In the structure shown in FIG. 16, a part between a common electrode EL2 and the pedestal MB is divided into two layers, i.e., the insulator layer IL5 and the insulating layer IL8. Further, the pixel electrode EL1 and the pedestal MB are connected through two contact holes CH3 and CH4 which penetrate through the two insulating layers IL5 and IL8, respectively. For example, if the thickness of the insulating layer IL5 in each of the above-described embodiments is approximately equal to a total of the thicknesses of the insulating layers IL5 and IL6 of the present embodiment, the third contact hole CH3 can be made small by the amount of reduction in the thickness of the insulating layer IL5 according to the structure of the present embodiment.

Since the third contact hole CH3 is near a liquid crystal layer LC, unevenness is produced in an alignment film AL1 depending on the shape thereof, and the thickness of the alignment film AL1 becomes unstable. In the present embodiment, since the third contact hole CH3 can be made small, unevenness produced in the alignment film AL1 can be suppressed, and the thickness of the alignment film AL1 also becomes stable. By the above feature, not only is the alignment of liquid crystal molecules in the vicinity of the third contact hole CH3 stabilized, the size of sub-pixels SP can also be reduced.

For example, the thickness of the insulating layer IL8 should preferably be 2 μm or less, and more preferably, 1 μm or less. If the width of the electrode connection layer EC is set to, for example, two-thirds or more of the width of the sub-pixel SP (i.e., the interval between signal lines S in the X direction), it is possible to obtain a sufficient area for establishing connection with the pixel electrode EL1 electrically, while insulating the adjacent electrode connection layers EC from each other.

Sixth Embodiment

A sixth embodiment will be described. Structures similar to those of each of the embodiments described above can be applied to structures not particularly mentioned.

Figure 18:
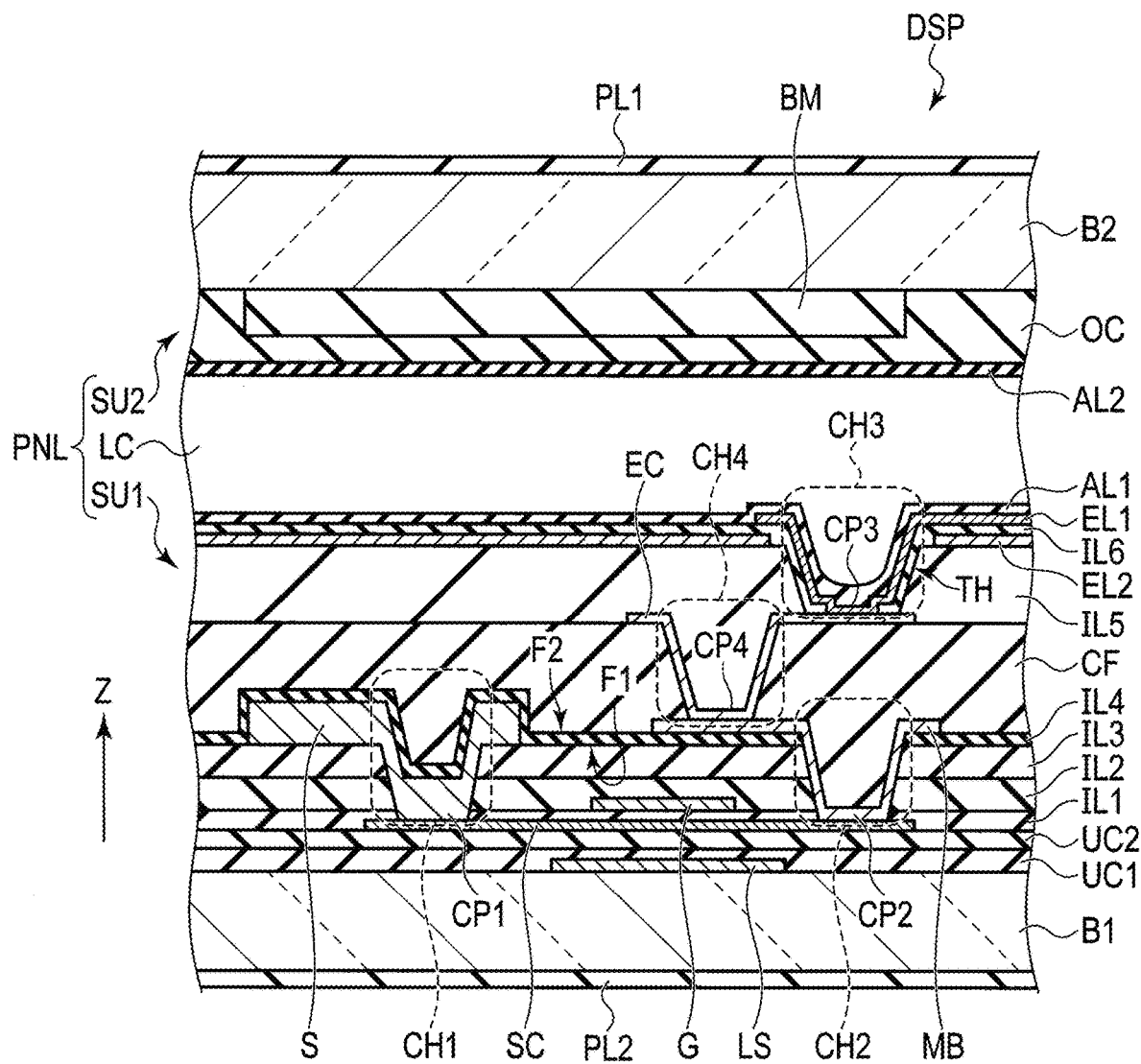
FIG. 18 is a schematic cross-sectional view of a display panel provided in a display device according to a sixth embodiment.

FIG. 18 is a schematic cross-sectional view of a display panel PNL provided in a display device DSP according to the present embodiment. The display panel PNL shown in FIG. 18 is different from the display panel PNL shown in FIG. 16 in that a second substrate SU2 does not comprise a color filter layer CF, but a first substrate SU1 comprises the color filter layer CF instead of an insulating layer IL8.

In the example of FIG. 18, an insulating layer IL1 (first inorganic film), an insulating layer IL2 (second inorganic film), an insulating layer IL3 (third inorganic film), an insulating layer IL4 (fourth inorganic film), the color filter layer CF, an insulating layer IL5 (organic film), an insulating layer IL6 (fifth inorganic film), and an alignment film AL1 are arranged in the Z direction (first direction) in this order.

A signal line S includes a first contact portion CP1 in contact with a semiconductor layer SC. A pedestal MB includes a second contact portion CP2 in contact with the semiconductor layer SC. A pixel electrode EL1 includes a third contact portion CP3 in contact with an electrode connection layer EC. The electrode connection layer EC includes a fourth contact portion CP4 in contact with the pedestal MB.

The first contact portion CP1 is in contact with the semiconductor layer SC through a first contact hole CH1. The second contact portion CP2 is in contact with the semiconductor layer SC through a second contact hole CH2. The third contact portion CP3 is in contact with the electrode connection layer EC through a third contact hole CH3. The fourth contact portion CP4 is in contact with the pedestal MB through a fourth contact hole CH4.

The third contact hole CH3 includes a through-hole TH penetrating through the insulating layer IL5 in the Z direction. The third contact portion CP3 is located inside the through-hole TH. In the example of FIG. 18, the through-hole TH overlaps the second contact hole CH2 in the Z direction. Further, the fourth contact hole CH4 does not overlap the second contact hole CH2 and the third contact hole CH3 in the Z direction.

The insulating layer IL4 includes a first face F1, and a second face F2 opposed to the first face F1 in the Z direction. The first face F1 is in contact with the signal line S and the insulating layer IL3. The second face F2 is in contact with the pedestal MB and the color filter layer CF.

For example, the fourth contact hole CH4 can be formed by performing dry etching on the color filter layer CF after forming color filters of respective colors, which are included in the color filter layer CF, without any gaps therebetween. As another example, when the color filters of the respective colors included in the color filter layer CF are to be formed, a gap region with no color filter may be provided in at least a part of the upper side of the pedestal MB. In this case, the electrode connection layer EC is electrically connected to the pedestal MB through the gap region. The gap region may have a shape extending in the X direction or the Y direction over a plurality of sub-pixels SP, for example. In this case, the color filter layer CF will have a plurality of gap regions arranged in stripes. If the color filter layer CF as described above is to be realized, it suffices that a difference between a mask dimension and a finished dimension in processing the color filters of the respective colors is 0.5 μm or less, for example, and more preferably, 0.2 μm or less.

In a liquid crystal display device, light which is emitted from an illumination device, and passes through a sub-pixel may not pass through a color filter corresponding to the above sub-pixel. In the following, such light is referred to as disconformity light. Since the disconformity light displays a color different from the color originally intended to be displayed, color mixture in adjacent sub-pixels may occur.

The color mixture is likely to occur in a region observed from a direction that is inclined relative to a substrate normal direction.

For example, in a VR viewer, a convex lens is arranged between a display panel and the eyes of the user in order to increase a viewing angle, and the greater the required viewing angle is, the greater the curvature of the convex lens becomes. In this case, the closer the region is to the edge of a field of view, the more the light which has passed through the display panel obliquely is likely to be observed. Thus, it is possible that color mixture occurs remarkably. Also, the higher the fineness of the sub-pixels is made, the more the color mixture is likely to occur.

The display panel PNL of the present embodiment employs the so-called Color Filter on Array (COA) method in which the color filter layer CF is provided in the first substrate SU1 (array substrate). In the COA method, there are such advantages that the color filter layer CF and the pixel electrode EL1 are close to each other, and that the color filter layer CF and the sub-pixels SP are not misaligned even if an error is made in bonding the first substrate SU1 and the second substrate SU2. Thus, disconformity light is less likely to occur by virtue of the above advantages. Accordingly, color mixture can be suppressed. Moreover, since color mixture is less likely to occur even if the sub-pixels SP are made highly fine, it is possible to realize extremely good display quality.

In view of the above, all of display devices, which can be implemented by a person of ordinary skill in the art on the basis of the display devices described as the embodiments of the present invention, and with design change made as appropriate, fall within the scope of the present invention as long as the gist of the present invention is covered.

A person of ordinary skill in the art can easily conceive various kinds of modification within the extent of ideas of the present invention, and it is considered that such modifications also fall within the scope of the present invention. For example, what is obtained by a person of ordinary skill in the art by adding or deleting the constituent elements or making a design change to each of the embodiments described above, or by adding or omitting the steps, or changing the condition is also included in the scope of the present invention as long as the gist of the present invention is provided.

In addition, as regards the other effect and advantages which can be brought about by the form of implementation described in each of the embodiments, ones that are obvious from the descriptions of the present specification, or that can be conceived by a person of ordinary skill in the art as required are considered to be obtainable by the present invention as a matter of course.

What is claimed is:

1. An array substrate comprising:
   a semiconductor layer;
   a scanning line which is opposed to the semiconductor layer, and to which a scanning signal is supplied;
   a first insulating layer provided above the semiconductor layer;
   a signal line which is electrically connected to the semiconductor layer through a first contact hole penetrating through the first insulating layer, and to which a video signal is supplied;
   a pedestal which is in contact with the semiconductor layer through a second contact hole penetrating through the first insulating layer;
   a second insulating layer provided above the pedestal; and
   a pixel electrode connected to the pedestal through a third contact hole penetrating through the second insulating layer, wherein
   the signal line and the pedestal are provided in layers different from each other.

2. The array substrate of claim 1, wherein a thickness of the pedestal is less than a thickness of the signal line.

3. The array substrate of claim 2, further comprising a third insulating layer provided between the first insulating layer and the second insulating layer, wherein:
   at least a part of the signal line is located between the first insulating layer and the third insulating layer; and
   at least a part of the pedestal is located between the third insulating layer and the second insulating layer.

4. The array substrate of claim 2, further comprising a wiring connection layer which is provided in a same layer as that of the pedestal, wherein:
   the wiring connection layer is in contact with the semiconductor layer through the first contact hole; and
   the signal line is electrically connected to the semiconductor layer through the wiring connection layer.

5. The array substrate of claim 4, further comprising a fourth insulating layer provided between the first insulating layer and the second insulating layer, wherein:
   at least a part of the signal line is located between the fourth insulating layer and the second insulating layer; and
   at least a part of the pedestal is located between the first insulating layer and the fourth insulating layer.

6. The array substrate of claim 1, wherein:
   the signal line contains copper;
   the first insulating layer includes a groove along the signal line; and
   the signal line is provided in the groove.

7. The array substrate of claim 2, further comprising:
   a fifth insulating layer provided between the first insulating layer and the second insulating layer; and
   an electrode connection layer in which at least a part of the electrode connection layer is located between the fifth insulating layer and the second insulating layer, wherein:
   the pixel electrode is electrically connected to the electrode connection layer through the third contact hole; and
   the electrode connection layer is electrically connected to the pedestal through a fourth contact hole penetrating through the fifth insulating layer.

8. The array substrate of claim 2, further comprising a color filter layer located between the first insulating layer and the second insulating layer.

9. The array substrate of claim 8, further comprising an electrode connection layer in which at least a part of the electrode connection layer is located between the color filter layer and the second insulating layer, wherein
   the electrode connection layer is electrically connected to the pedestal through a fourth contact hole penetrating through the color filter layer.

10. A liquid crystal display device comprising:
    a first substrate;
    a second substrate opposed to the first substrate in a first direction; and
    a liquid crystal layer which is arranged between the first substrate and the second substrate in the first direction, wherein:
    the first substrate comprises a first base, a first inorganic film, a second inorganic film, a third inorganic film, a fourth inorganic film, a color filter layer, a semiconductor layer, a signal line to which a video signal is supplied, and a metallic pedestal;

the first inorganic film, the second inorganic film, the third inorganic film, the fourth inorganic film, and the color filter layer are arranged in order in the first direction;

the semiconductor layer is between the first base and the first inorganic film in the first direction;

the signal line includes a first contact portion in contact with the semiconductor layer, the first contact portion being in contact with the semiconductor layer through a first contact hole penetrating through the first inorganic film, the second inorganic film, and the third inorganic film;

the pedestal includes a second contact portion in contact with the semiconductor layer, the second contact portion being in contact with the semiconductor layer through a second contact hole penetrating through the first inorganic film, the second inorganic film, the third inorganic film, and the fourth inorganic film;

the fourth inorganic film includes a first face, and a second face opposed to the first face in the first direction, the first face being in contact with the signal line, the second face being in contact with the pedestal; and a thickness of the first contact portion in the first direction is greater than a thickness of the second contact portion in the first direction.

11. The liquid crystal display device of claim 10, wherein:
the first substrate further comprises a pixel electrode, and an electrode connection layer which connects the pixel electrode and the pedestal; and
the electrode connection layer comprises a transparent conductive material.

12. The liquid crystal display device of claim 11, wherein:
the first substrate further comprises an organic film, a fifth inorganic film, and an alignment film;
the organic film, the fifth inorganic film, and the alignment film are arranged in order in the first direction from the color filter layer toward the liquid crystal layer;
the pixel electrode is between the color filter layer and the alignment film in the first direction;
the electrode connection layer is between the fourth inorganic film and the organic film in the first direction;
the pixel electrode includes a third contact portion in contact with the electrode connection layer, the third contact portion being in contact with the electrode connection layer through a third contact hole penetrating through the fifth inorganic film;
the electrode connection layer includes a fourth contact portion in contact with the pedestal, the fourth contact portion being in contact with the pedestal through a fourth contact hole penetrating through the color filter layer; and
the third contact portion of the pixel electrode is located inside a through-hole formed in the organic film.

13. The liquid crystal display device of claim 12, wherein:
the through-hole overlaps the second contact hole in the first direction; and
the fourth contact hole does not overlap the second contact hole in the first direction.

14. The liquid crystal display device of claim 12, wherein:
the first substrate further comprises a common electrode located between the organic film and the fifth inorganic film in the first direction; and
the pixel electrode, the common electrode, and the electrode connection layer are formed of transparent conductive materials.

15. The liquid crystal display device of claim 10, wherein the second face of the fourth inorganic film is in contact with the color filter layer, and the first face of the fourth inorganic film is in contact with the third inorganic film.

16. The liquid crystal display device of claim 15, wherein:
each of the third inorganic film, the fourth inorganic film, and the fifth inorganic film is a silicon-nitride film; and
each of the first inorganic film and the second inorganic film is a silicon oxide film.

* * * * *